(12) United States Patent
Wainerdi et al.

(10) Patent No.: US 8,753,924 B2
(45) Date of Patent: Jun. 17, 2014

(54) GROWN CARBON NANOTUBE DIE ATTACH STRUCTURES, ARTICLES, DEVICES, AND PROCESSES FOR MAKING THEM

(75) Inventors: James Cooper Wainerdi, Plano, TX (US); Luigi Colombo, Dallas, TX (US); John Paul Tellkamp, Rockwall, TX (US); Robert Reid Doering, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 127 days.

(21) Appl. No.: 13/414,902

(22) Filed: Mar. 8, 2012

(65) Prior Publication Data

US 2013/0234313 A1  Sep. 12, 2013

(51) Int. Cl.
*H01L 21/00* (2006.01)
*H01L 23/10* (2006.01)

(52) U.S. Cl.
USPC ........... 438/122; 257/675; 257/706; 257/734; 257/783; 257/E23.01; 257/E23.08; 257/E23.16; 257/E21.514

(58) Field of Classification Search
USPC ......... 257/706, 707, 783, 787, 675, 734, 753, 257/E23.01, E23.08, E23.16, E21.514; 438/122; 977/742, 842
See application file for complete search history.

(56) References Cited

U.S. PATENT DOCUMENTS

| | | | |
|---|---|---|---|
| 3,716,764 A | 2/1973 | Birchler et al. | |
| 6,232,706 B1 | 5/2001 | Dai et al. | |
| 6,518,647 B1 | 2/2003 | Tellkamp | |
| 7,413,934 B2 | 8/2008 | Tellkamp | |
| 7,456,052 B2 * | 11/2008 | White et al. | 438/122 |
| 7,589,403 B2 * | 9/2009 | Bauer et al. | 257/676 |
| 7,658,865 B2 * | 2/2010 | Lu | 252/299.01 |
| 7,791,194 B2 * | 9/2010 | Gektin et al. | 257/734 |
| 7,847,394 B2 * | 12/2010 | Dubin et al. | 257/706 |
| 7,893,432 B2 * | 2/2011 | Hannah et al. | 257/48 |
| 8,106,510 B2 * | 1/2012 | Altman et al. | 257/739 |
| 8,304,291 B2 * | 11/2012 | Touzelbaev et al. | 438/122 |
| 2004/0007784 A1 | 1/2004 | Skipor et al. | |
| 2005/0027078 A1 | 2/2005 | Scheifers et al. | |
| 2006/0198956 A1 | 9/2006 | Eres | |
| 2006/0278901 A1 | 12/2006 | Dangelo et al. | |
| 2007/0298525 A1 | 12/2007 | Raravikar et al. | |

(Continued)

OTHER PUBLICATIONS

Halonen, N. et al. Low-temperature growth of multi-walled carbon nanotubes by thermal CVD. Phys. Status Solidi B 248, No. 11,2500-2503 (2011). FIGS. 1-4.

(Continued)

*Primary Examiner* — Jasmine Clark
(74) *Attorney, Agent, or Firm* — Wade J. Brady, III; Frederick J. Telecky, Jr.

(57) ABSTRACT

An article of manufacture includes a semiconductor die (110) having an integrated circuit (105) on a first side of the die (110), a diffusion barrier (125) on a second side of the die (110) opposite the first side, a mat of carbon nanotubes (112) rooted to the diffusion barrier (125), a die attach adhesive (115) forming an integral mass with the mat (112) of the carbon nanotubes, and a die pad (120) adhering to the die attach adhesive and (115) and the mat (112) of carbon nanotubes for at least some thermal transfer between the die (110) and the die pad (120) via the carbon nanotubes (112). Other articles, integrated circuit devices, structures, and processes of manufacture, and assembly processes are also disclosed.

60 Claims, 11 Drawing Sheets

(56) References Cited

U.S. PATENT DOCUMENTS

| | | |
|---|---|---|
| 2008/0083612 A1 | 4/2008 | Wang et al. |
| 2008/0251757 A1 | 10/2008 | Yamamoto et al. |
| 2008/0292840 A1 | 11/2008 | Majumdar et al. |
| 2009/0008779 A1 | 1/2009 | Suhir et al. |
| 2009/0108437 A1 | 4/2009 | Raymond |
| 2009/0122486 A1 | 5/2009 | Mouli et al. |
| 2009/0127712 A1 | 5/2009 | Wyland |
| 2009/0136413 A1 | 5/2009 | Li et al. |
| 2009/0169463 A1 | 7/2009 | Smalley et al. |
| 2009/0186962 A1 | 7/2009 | Kondo et al. |
| 2009/0213551 A1 | 8/2009 | Wyland |
| 2009/0218681 A1 | 9/2009 | Chrysler et al. |
| 2009/0246367 A1 | 10/2009 | Huotari et al. |
| 2009/0256255 A1 | 10/2009 | Gektin et al. |
| 2009/0257945 A1 | 10/2009 | Biris et al. |
| 2010/0003771 A1 | 1/2010 | Nagai et al. |
| 2010/0078799 A1 | 4/2010 | Zarbock et al. |
| 2010/0083873 A1 | 4/2010 | Oxley |
| 2010/0092369 A1 | 4/2010 | Parsapour |
| 2010/0193961 A1 | 8/2010 | Konishi et al. |
| 2010/0196659 A1 | 8/2010 | Razeeb et al. |
| 2010/0196695 A1 | 8/2010 | Garcia et al. |
| 2010/0209696 A1 | 8/2010 | Seals et al. |
| 2010/0264553 A1 | 10/2010 | Wainerdi et al. |
| 2011/0032678 A1 | 2/2011 | Altman et al. |
| 2011/0132811 A1 | 6/2011 | Wainerdi et al. |
| 2011/0281509 A1 | 11/2011 | Tanaka et al. |
| 2011/0316173 A1 | 12/2011 | Patti et al. |
| 2012/0021540 A1 | 1/2012 | Takahashi et al. |
| 2012/0094484 A1* | 4/2012 | Altman et al. ............... 438/666 |

OTHER PUBLICATIONS

Magrez, A. et al. Low-Temperature, Highly Efficient Growth of Carbon Nanotubes on Functional Materials by an Oxidative Dehydrogenation Reaction. ACS Nano, 2010, 4(7), pp. 3702-3708. FIGS. 6(a)-6(c), 7.

Polymerics gmbh. (2002) Bismaleimides. 2 pp. http://www.polymerics.de/technology/bmi_en.html All 3 FIGS.

* cited by examiner

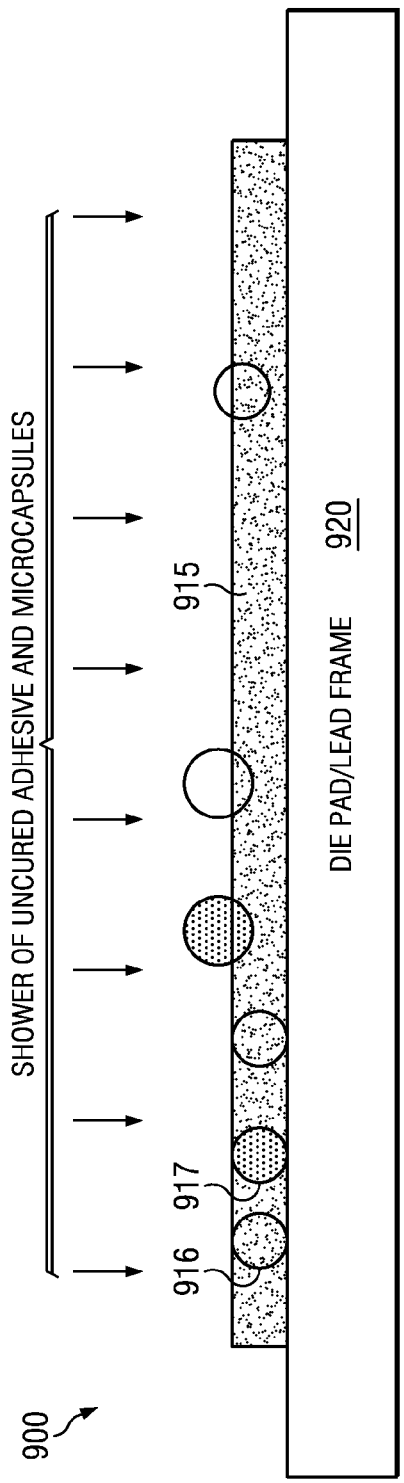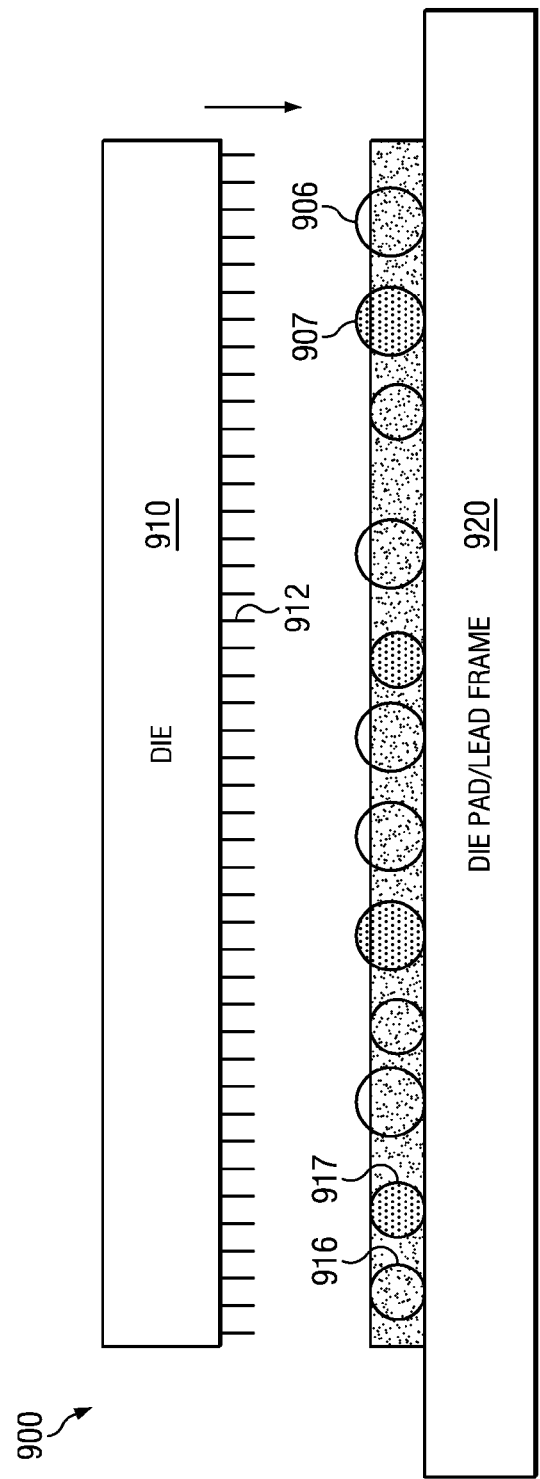

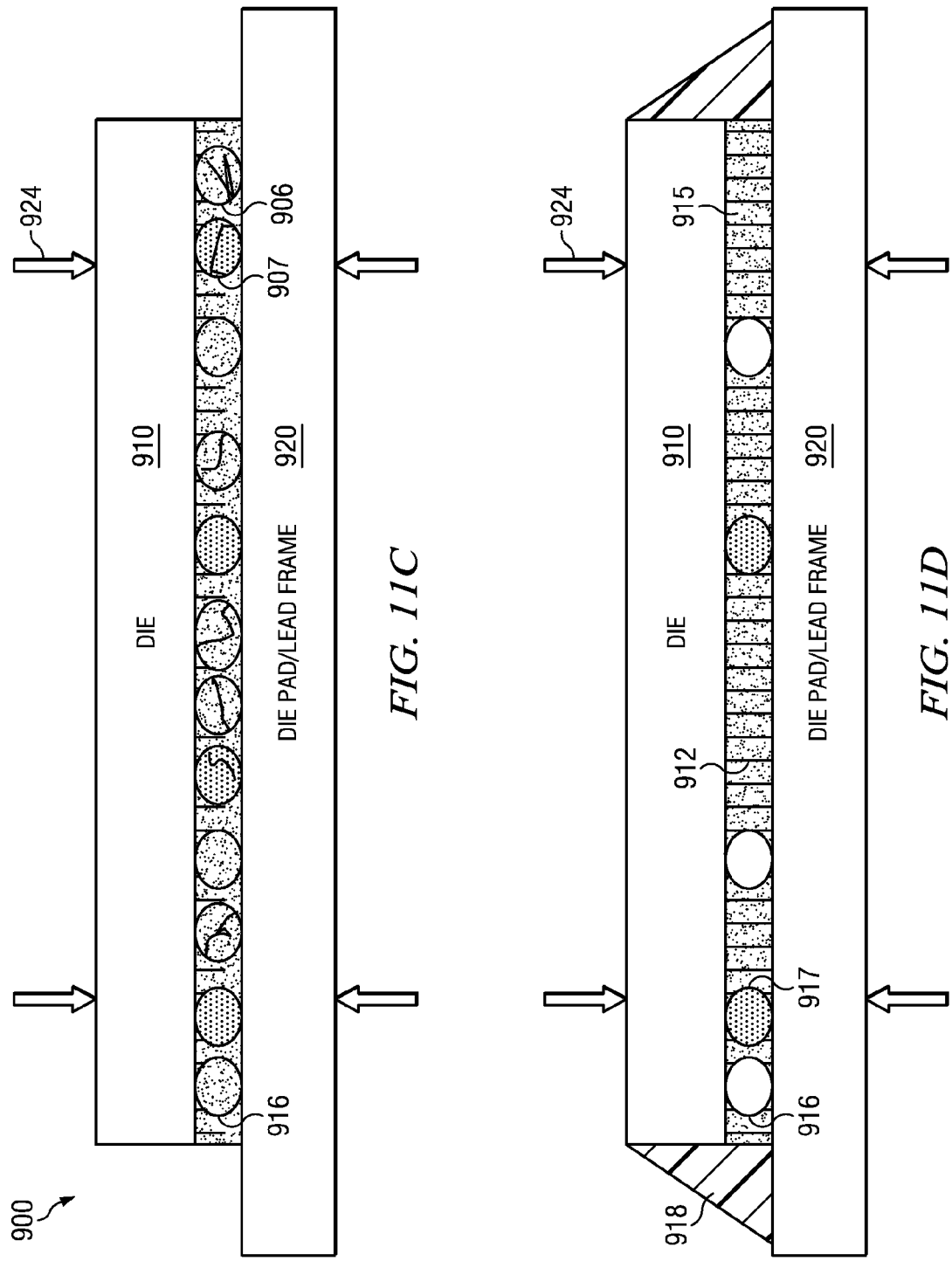

GROWN CARBON NANOTUBE DIE ATTACH STRUCTURES, ARTICLES, DEVICES, AND PROCESSES FOR MAKING THEM

CROSS-REFERENCES TO RELATED APPLICATIONS

This application is related to U.S. Patent Application Publication 20100264553 "Packaged Electronic Device Having Metal Comprising Self-Healing Die Attach Material" dated Oct. 21, 2010, and which is incorporated herein by reference in its entirety.

STATEMENT REGARDING FEDERALLY SPONSORED RESEARCH OR DEVELOPMENT

Not applicable.

COPYRIGHT NOTIFICATION

Portions of this patent application contain materials that are subject to copyright protection. The copyright owner has no objection to the facsimile reproduction by anyone of the patent document, or the patent disclosure, as it appears in the United States Patent and Trademark Office, but otherwise reserves all copyright rights whatsoever.

BACKGROUND

The technological field relates to assembly, test and packaging processes, structures and materials in semiconductor device manufacturing, and qualification, reliability and failure analysis processes.

Lead frames or other supports for semiconductor devices provide a stable support pad called a die pad for firmly positioning a semiconductor integrated circuit (IC) chip or die within a package or on another support for the chip. In addition to the chip die pad, a lead frame offers a plurality of conductive segments to bring various electrical conductors into close proximity to the chip. Types of package materials for an IC chip may be ceramic or plastic, for instance. The package encloses and protects the IC chip, and the exterior of the package is labeled, as may be visible on a printed circuit board in a consumer device or other electronic unit.

Single-piece lead frames are suitably manufactured from thin sheets of starting metal. The desired shape of the lead frame is stamped or etched from an original sheet. The conductive lead frame segments bring various electrical conductors into close proximity of the chip. The end of the lead frame segments nearer to the IC chip ("inner" ends) are electrically and mechanically connected to so-called connections or connectors, e.g., wires, that go to contact pads on the IC surface. The IC contact pads are also called bond pads and are fabricated on, and connecting internally to, the microscopic integrated circuit structures deposited or made in, on and over a semiconductor substrate. The spatial distances or gaps between the inner ends of the lead frame segments and the IC contact pads are thus bridged by the connections, typically thin metal wires such as gold individually bonded to the IC contact pads and to the lead frame segments. Consequently, the surfaces of the provided inner ends of lead frame segments are chosen to be metallurgically suitable for stitch-attaching the connectors. The end of the lead frame segments remote from the IC chip ("outer" ends) are electrically and mechanically connected subsequently to external circuitry such as a printed circuit board by soldering.

The lead frame provides a stable frame and die pad for a chip. A die attach material is used with dispensed die attach adhesives to form an adhesive bond between the IC die or and lead frame. A ceramic package may be used, or a low-cost molding instead may be provided to plastic-encapsulate the IC die and connecting wires. BGA (ball grid array), QFN (Quad Flat No-lead) and SON (Small Outline No-lead) are among many forms of such packaging known today. The packaged chips are borne by the lead frame and are cut apart from one another and the cut-off exterior supporting portion of the lead frame is discarded.

Among its other functions, a lead frame can provide a path for thermal conduction of heat to leave the IC chip. Problematically, however, the dispensed die attach adhesive generally cures into a resin layer of adhesive material that interposes a thermal barrier skin effect between the die and lead frame even as the die and lead frame form an adhesive physical bond or die attach interface between them. The thickness of the die attach adhesive is called the bond line thickness BLT.

The adhesive physical bond is subject to problems including physical integrity and moisture entry which can limit IC life and introduce failures. Stress-induced die attach delamination (separation or tearing) is a leading package-related failure mechanism for Moisture Sensitivity Level (MSL) failures. Even beyond the thermal barrier skin effect noted above for a die attach that has not failed, stress-induced die attach delamination failure further degrades the thermal path as well.

Various approaches have been proposed by others to solve these problems. Carbon nanotubes (CNTs) have high thermal conductivity and other remarkable properties, and have been discussed for possible chip application, but discovering practical ways of providing useful CNT structures and applying CNTs for actual volume manufacturability challenges the industry. Inventive improvements for solving the above problems and other problems continue to be of high interest and most desirable in this art because of the manifest importance of volume manufacturability, reliability, performance and economy to the semiconductor industry and users alike.

SUMMARY OF THE INVENTION

Generally, and in one form of the invention, an article of manufacture includes a semiconductor die having an integrated circuit on a first side of the die, a diffusion barrier on a second side of the die opposite the first side, a mat of carbon nanotubes rooted to the diffusion barrier, a die attach adhesive forming an integral mass with the mat of the carbon nanotubes, and a die pad adhering to the die attach adhesive and the mat of carbon nanotubes for at least some thermal transfer between the die and the die pad via the carbon nanotubes.

Generally, one process form of the invention involves a process of manufacturing including fabricating integrated circuits on a first side of a semiconductor wafer, forming a diffusion barrier on a second side of the semiconductor wafer opposite the first side, growing a mat of carbon nanotubes on the diffusion barrier, and mounting the thus-matted semiconductor wafer to adhesive dicing tape so that the adhesive dicing tape adheres to the mat of carbon nanotubes.

Generally, and in another process form of the invention, an assembly process of manufacturing includes providing a semiconductor die that has a mat of carbon nanotubes adhering to adhesive dicing tape, exposing the dicing tape to radiant energy so that the dicing tape becomes less adhesive, and then detaching the dicing tape from the mat of carbon nanotubes leaving the mat of carbon nanotubes substantially intact on the die.

Generally, and in a further process form of the invention, an assembly process of manufacturing includes providing a semiconductor die that has a mat of carbon nanotubes adhering to adhesive dicing tape, exposing the dicing tape to radiant energy so that the dicing tape becomes less adhesive, and then detaching the dicing tape from the mat of carbon nanotubes leaving the mat of carbon nanotubes substantially intact on the die, dispensing die attach adhesive to a die pad, performing a pick-and-place of the die with the mat of carbon nanotubes onto the die attach adhesive on the die pad, and pressing the die and die pad together so that the mat of carbon nanotubes and the die attach adhesive form an integral mass of die attach material between the die and the die pad.

Generally, and in another form of the invention, an article of manufacture includes a semiconductor wafer having integrated circuits on a first side of the wafer, a diffusion barrier on at least part of a second side of the wafer opposite the first side, a mat of carbon nanotubes rooted to the diffusion barrier, and adhesive dicing tape adhering to the mat of carbon nanotubes.

Generally, and in a further form of the invention, an article of manufacture includes a semiconductor die having an integrated circuit on a first side of the die, a diffusion barrier on a second side of the die opposite the first side, a mat of carbon nanotubes rooted to the diffusion barrier, and adhesive dicing tape adhering to the mat of carbon nanotubes.

Other articles, integrated circuit devices, structures, and processes of manufacture, and assembly processes are also disclosed and claimed.

BRIEF DESCRIPTION OF THE DRAWINGS

FIGS. 11A-11D are cross-sections of another inventive structure in an inventive assembly process proceeding from FIG. 11A to FIG. 11D.

Corresponding numerals in different Figures indicate corresponding parts except where the context indicates otherwise. A minor variation in capitalization or punctuation for the same thing does not necessarily indicate a different thing. A suffix .i or .j refers to any of several numerically suffixed elements having the same prefix.

DETAILED DESCRIPTION OF EMBODIMENTS

Various embodiments provide solutions to these and other problems and use carbon nanotubes (CNTs) as part of a die attach material composite or solely as the die attach material instead. Stress-induced die attach delamination can be significantly reduced. CNTs have a variety of compositions and properties. All three types of CNTs (so-called metallic, non-metallic, and semiconducting) have excellent thermal conductive properties and metallic CNTs also are excellent carbon-based electrical conductors that can benefit the die attach of some packaged IC embodiments as well.

CNTs have superior thermal conductivity, higher than any other die attach materials such as composite materials using silver Ag particles. Moreover, CNTs have higher physical flexibility than materials currently used for die attach materials and also can provide or have better Coefficient of Thermal Expansion (CTE) coupling between, e.g., a silicon Si die and a lead frame such as made of copper Cu, copper alloys, iron-nickel alloys (e.g., "Alloy 42"), aluminum, or otherwise. This superior flexibility allows for a thinner bond line thickness BLT dimension between die and lead frame, which reduces the amount of die attach material involved and improves thermal performance. A reason for this is that, given an opposing broadside width W of the facing die and lead frame, the shear stress in a conventional more-nearly rigid die attach structure and likelihood of die attach delamination can be expected to increase with a physical angle A indicated by the ratio $(W*CTE*\Delta T)/BLT$, where $\Delta T$ is temperature rise. This CNT die attach structure flexes in response to shear stress and can solve or greatly reduce incidence of the problem of stress-induced die attach delamination that might otherwise degrade the thermal path and lead to package-related Moisture Sensitivity Level (MSL) failure.

For some background on lead frames, die pads, and die attach materials, see U.S. Pat. No. 6,518,647 "Plated Aluminum Lead frames for Semiconductor Devices, Including Two Nickel Layers, and Method of Fabrication" (TI-28501) dated Feb. 11, 2003; and U.S. Pat. No. 7,413,934 "Lead frames for Improved Moisture Reliability and Enhanced Solderability of Semiconductor Devices" (TI-60791), both of which patents are hereby incorporated herein by reference.

Figure 1A:
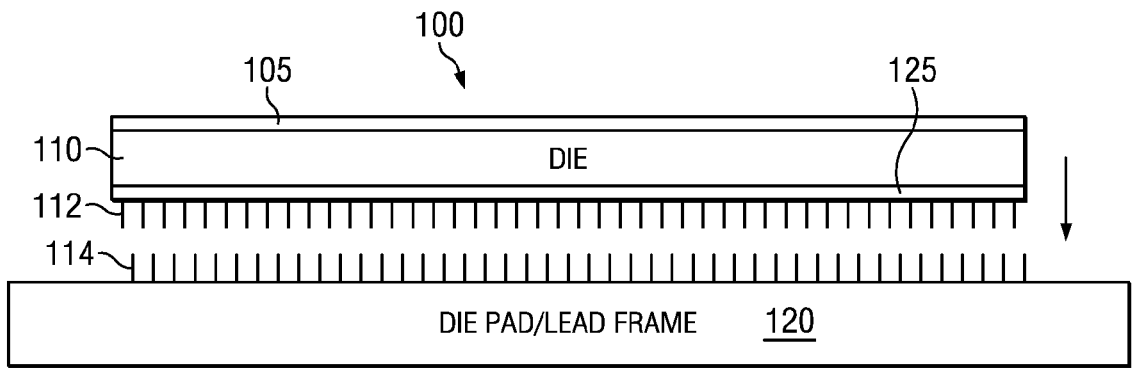
FIGS. 1A and 1B are cross-sections of an inventive structure in an inventive assembly process proceeding from FIG. 1A to FIG. 1B.
Figure 1B:
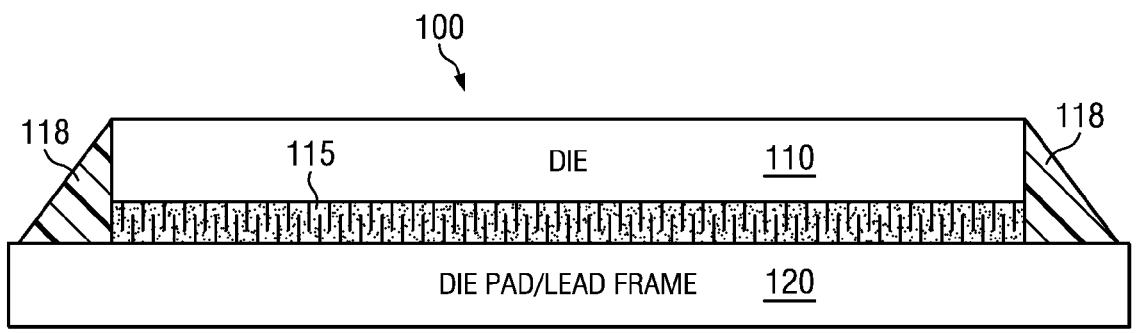

In a first embodiment 100 of FIGS. 1A-1B, vertical CNT bristles 112 and 114 are grown as respective CNT forests rooted on the substrate backside of an IC die 110 and rooted on the die pad of lead frame 120 with an area density, e.g. to exceed 1000 CNT bristles per square micron or more. The structure is then pour-filled or mist-filled with epoxy using an upward or downward showerhead dispense technique. The process of assembly of bristled lead frame with bristled substrate uniformly interdigitates CNT bristles 112 with opposing CNT bristles 114 while maintaining secure physical attachment of CNT bristles to each surface upon which they are grown. In other words, a mat of carbon nanotubes is interdigitated with the other mating mat of carbon nanotubes densely at the scale of bristle-to-bristle (nanotube-to-nanotube) separation in each of the mats. Die attach processing of FIGS. 1A, 1B is automated for production-volume assembly. The process avoids dislodging CNT bristles 114 from lead frame 120 on which they are grown, or captures and disposes of those bristles that are dislodged from the lead frame 120.

In FIGS. 1A and 1B, first embodiment 100 has an integrated circuit die 110 having an integrated circuit 105 on one side of the die 110 and with first CNTs 112 grown from the backside (non-functional side) of the integrated circuit die 110 on backside barrier metallization 125 deposited thereon beforehand. Also, second CNT bristles 114 are grown from the topside (die attach surface) of the lead frame 120. In FIG. 1B, a material 115 such as a chemical adhesive or solder material is interstitially dispersed through one or both of the first CNTs 112 and second CNTs 114 of FIG. 1A. The integrated circuit die 110 with first-grown CNTs is progressively advanced downward as indicated in FIG. 1A into place closer and almost into juxtaposition with the lead frame 120 so that the first CNTs 112 and second CNTs 114 become substantially interdigitated. The already-applied material 115 also becomes interstitially well-dispersed between the first CNTs 112 and second CNTs 114. Some adhesive 115 is displaced outward, and further adhesive of same or different composition is additionally applied so that a protective boundary ring 118 results.

Notice that this embodiment and at least some other embodiments herein provide generally planar, uniform, full-area structures and processing of the entire wafer and entire die. Microscopic surface roughening is optional preparatory to growth of the CNT forest or mat, and such surface roughening maintains the generally planar, uniform, full-area geometry. CNT growth is arranged to uniformly produce a generally planar, uniform, full-area of CNT forest or a black mat thereof visible to the naked eye. CNT growth arises from and is rooted to at least one of the solid surfaces (e.g., diffusion barrier 125 of die 110, and/or die pad/lead frame 120). Rooted CNT growth pierces and significantly bypasses a thermal barrier skin effect of subsequently-applied die attach adhesive, which flows and cures around the base of each CNT bristle and thus is structurally prevented from forming a thermal barrier skin on the solid surface at the base where each CNT bristle is rooted. Moreover, rooting a CNT mat to at least one of the opposing solid surfaces provides physical integrity and strength for the structure-in-progress during and between intermediate process steps. Advancing the structure to closure after dispensing of die attach adhesive delivers a generally planar, uniform, full area die attach that avoids complicated corners, walls, channels, and lateral interfaces. That way, masking, patterning, and patterned etching for a CNT-based die attach are eliminated or obviated, and that promotes increased processing speed, structural quality and reliability, and engineering economy for volume production.

Figure 2A:
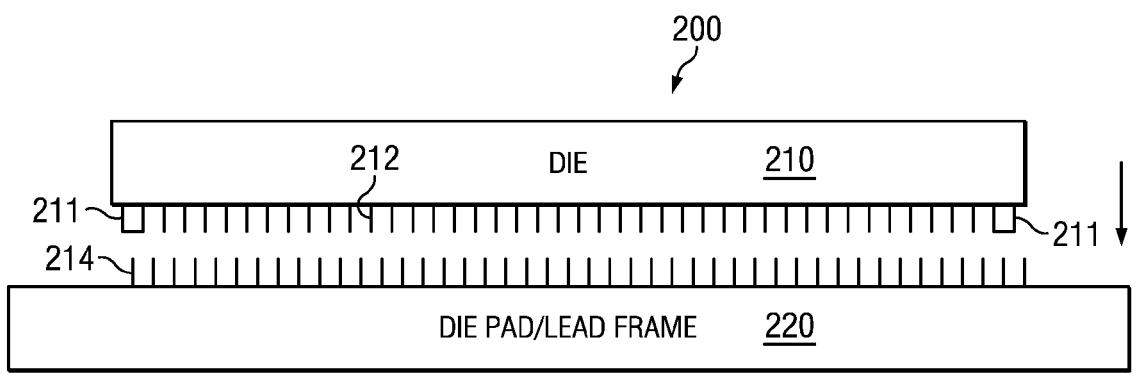
FIGS. 2A and 2B are cross-sections of another inventive structure in an inventive assembly process proceeding from FIG. 2A to FIG. 2B.
Figure 2B:
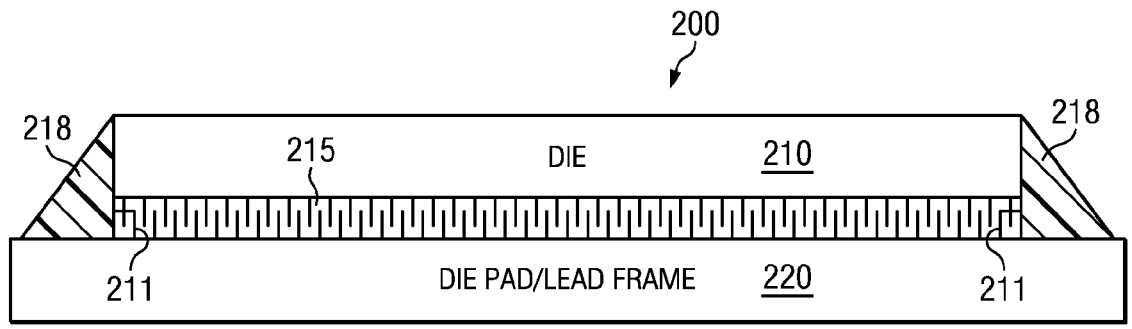

In a second embodiment 200 in FIGS. 2A-2B, vertical CNTs 212 are grown with sufficiently density for thermal transfer on and from the silicon wafer substrate from which die 210 is cut. Die 210 with CNTs 212 is then mounted on the lead frame 120 that itself has vertical CNTs 214 grown on the lead frame 220. These two CNT arrays 212, 214 are pressed together to mesh together like the bristles on two brushes. Posts, bumps, spacers, ridges or like structures 211 may be formed on either or both of die 210 and lead frame 220, or by etching either of them, and utilized to minimize/prevent unintentional mashing or collapsing of the vertical CNTs 212, 214 in some embodiments. These structures provide upraised elements on the backside (e.g. second side) of the die and having a height approximately equal to or exceeding a thickness of the mat of carbon nanotubes. With handling as described herein, it is believed that such upraised elements are optional.

In FIGS. 2A and 2B, second embodiment 200 has an integrated circuit die 210 with first CNTs 212 grown from the backside (non-functional side) of the integrated circuit die 210 from the silicon having backside barrier metallization thereon. Also, second CNTs 214 are grown from the topside (die attach surface) of the lead frame 220. The integrated circuit die 210 with its grown CNTs 212 dry is progressively advanced downward as indicated in FIG. 2A into place closer and almost into juxtaposition with the lead frame 220 so that the first CNTs 212 and second CNTs 214 become substantially interdigitated. Some encapsulation material is additionally applied so that a protective boundary ring 218 results as part of an encapsulation process (compare encapsulation 540 240 of FIG. 5).

Figure 3A:
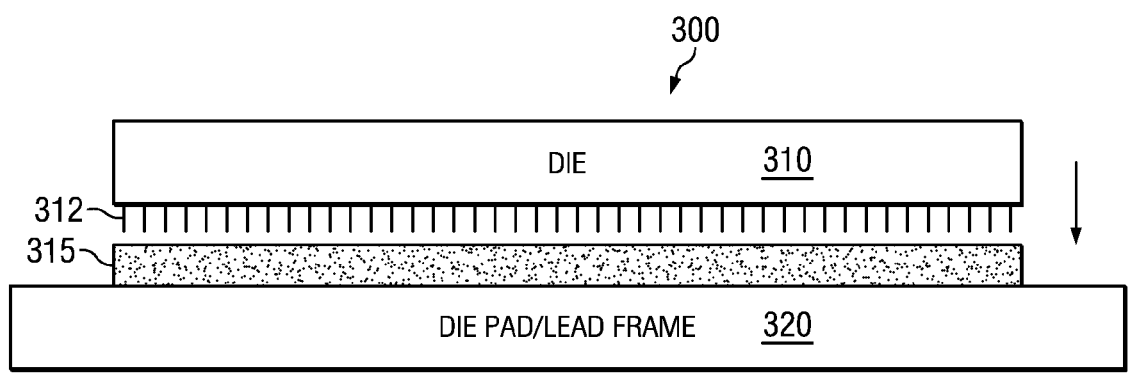
FIGS. 3A and 3B are cross-sections of another inventive structure in an inventive assembly process proceeding from FIG. 3A to FIG. 3B.
Figure 3B:
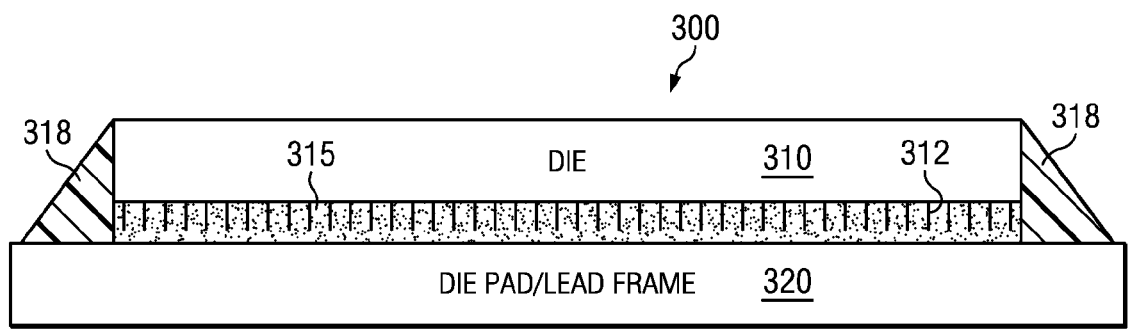

In a third embodiment of FIGS. 3A-3B, vertical CNT bristles 312 are grown only on the silicon wafer substrate for die 310. Growth is executed to achieve a CNT density sufficient for substantial thermal transfer. The grown die 310 is then mounted on a lead frame 320 filled or covered with epoxy or other die attach adhesive 315 in its die pad area. Die attach adhesive 318 seals and secures the periphery of die attach adhesive 315 after the structure is closed together. Adhesive 318 results from expulsion of some of the die attach adhesive 315 during the press operation of FIG. 3B, and/or additional such adhesive 318 is applied.

In FIGS. 3A and 3B, third embodiment 300 has an integrated circuit die 310 with first CNTs 312 grown from the backside (non-functional side) of the silicon or other integrated circuit die 310 from a backside barrier layer. In FIG. 3A, a material 315 such as a chemical adhesive or solder material is spread or applied to form a layer 315 on a lead frame 320. The integrated circuit die 310 with first CNTs is progressively advanced downward as indicated in FIG. 3A into place closer and almost into juxtaposition with the lead frame 320 so that the already-applied material 315 becomes interstitially well-dispersed among the first CNTs 312. Some adhesive 315 is displaced outward and further adhesive of same or different composition is additionally applied so that a protective boundary ring 318 results.

The process of FIGS. 3A and 3B economically performs one CNT growth sub-process instead of two CNT growth sub-processes as in FIGS. 1A-1B or FIGS. 2A-2B. Also, dispensing of the adhesive 315 can be executed directly on lead frame 320 prior to closing together the structure 300. To obtain an equivalent final density of CNTs in the die attach, the process of FIGS. 3A and 3B should be run for a longer time or otherwise with different process parameters to yield an approximately doubled density of CNTs compared to CNT density grown on either die 110 or 210.

In the industry, wafer fabrication is likely to occur at a fab factory site that is at some distance from an assembly/test A/T site. Applying a CNT growth process to an entire silicon wafer prior to sawing is likely to be more economical at one of the sites (e.g., fab site) and may be either uneconomical or infeasible at the other site (e.g., A/T). Moreover, process qualification or 'qual' for FIGS. 3A-3B may be conveniently completed at the wafer fab site, with much less corresponding qualification ('qual') effort at an A/T site remotely.

Figure 3C:
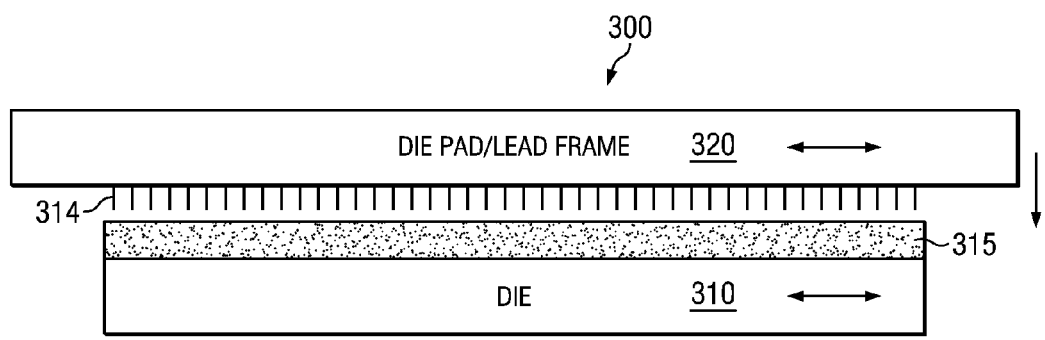
FIGS. 3C and 3D are cross-sections of another inventive structure in an inventive assembly process proceeding from FIG. 3C to FIG. 3D.
Figure 3D:
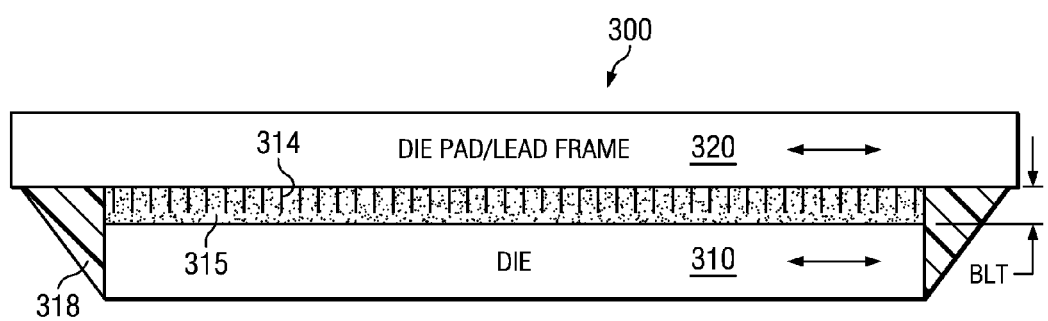

In FIGS. 3C and 3D, some other embodiments reverse die 310 and lead frame 320 so that CNTs 314 are on lead frame 320 above, and the adhesive 315 is provided as a liquid layer on die 310 beneath. Applying a CNT growth process to lead frames 320 may be more economical at the A/T site to which the lead frames are ordinarily delivered and consumed. Note also that no backside barrier layer 125 is applied to die 310, so that wafer fab site operations are unchanged, and all the process operations in FIGS. 3C-3D are suitably performed at the A/T site. Moreover, higher temperature processes as well as or instead of lower temperature processes may be used for growing CNTs 314 on the lead frame 320 than might be feasible for growing FIG. 3A CNTs 312 on the die 310. This provides a somewhat wider scope of CNT growth process options in this FIG. 3C embodiment than in FIG. 3A because the CNT growth temperature for FIG. 3A should not disturb the integrated circuit structures already fabricated on the circuit side of the wafer.

In FIGS. 3C and 3D, the process then advances lead frame 320 already grown with CNT bristles 314 so that they descend toward die 310. Also, the CNTs 314 are somewhat extended by touching and wetting with the surface of the wet, uncured die attach adhesive 315. As the lead frame 320 with its CNTs 314 descends, the CNTs 314 penetrate the surface of the wet, uncured adhesive 315 and descend through adhesive 315 with their interstitial dispersal substantially uniform; and the CNTs 314 touch the die 310 backside beneath and bend slightly, thereby completing a thermal contact. The adhesive 315 is then cured to form a flexible CNT-populated film (314, 315) joining the nearly-juxtaposed die 310 and lead frame 320 and having a bond line thickness BLT.

Figure 4A:
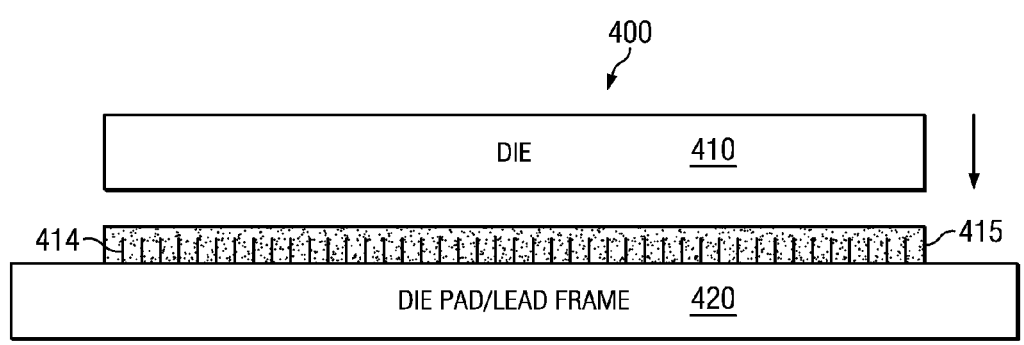
FIGS. 4A and 4B are cross-sections of another inventive structure in an inventive assembly process proceeding from FIG. 4A to FIG. 4B.
Figure 4B:
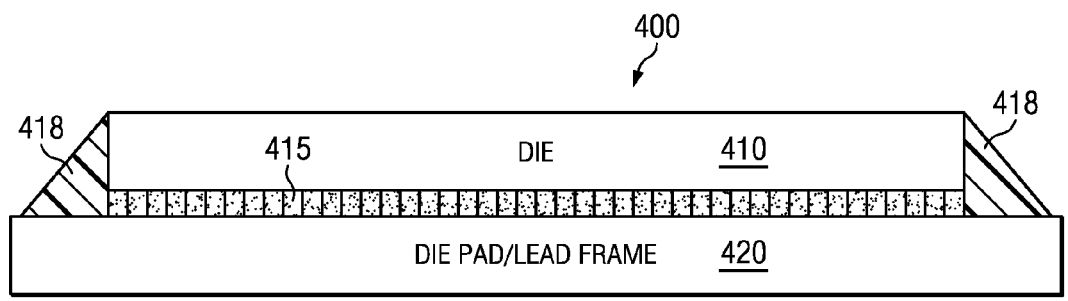

In FIGS. 4A and 4B, a fourth embodiment 400 has an integrated circuit die 410 and a lead frame or substrate 420. CNTs 414 are grown from the topside (die attach surface) of the lead frame 420. Notice that higher temperature processes or lower temperature processes may be used for growing CNTs on the lead frame 420 than might be feasible for growing CNTs on the die 410, thus providing a wide scope of CNT growth process options in this FIG. 4A embodiment. A material 415 such as a chemical adhesive is spread or applied to form a layer 415 on the CNTs 414 on lead frame 420. In FIG. 4A, a CNT forest may thus be used as highly thermally conductive, flexible material in the die attach adhesive 415.

The integrated circuit die 410 is progressively advanced backside downward as indicated in FIG. 4A into place closer and almost into juxtaposition with the lead frame 420. The CNTs 414 are made to touch or almost touch integrated circuit die 410, and the already-applied material 415 adheres to integrated circuit die 410. Some adhesive 415 is displaced outward and further adhesive of same or different composition is additionally applied so that a protective boundary ring 418 results. Some other embodiments reverse die 410 and lead frame 420 so that the CNTs 414 and the adhesive 415 are on die 410, whereupon lead frame 420 descends toward die 410.

Figure 4C:
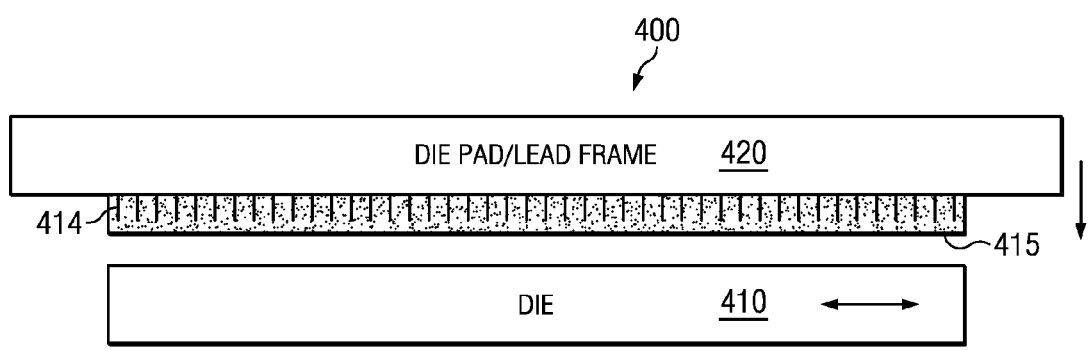
FIGS. 4C and 4D are cross-sections of another inventive structure in an inventive assembly process proceeding from FIG. 4C to FIG. 4D.
Figure 4D:
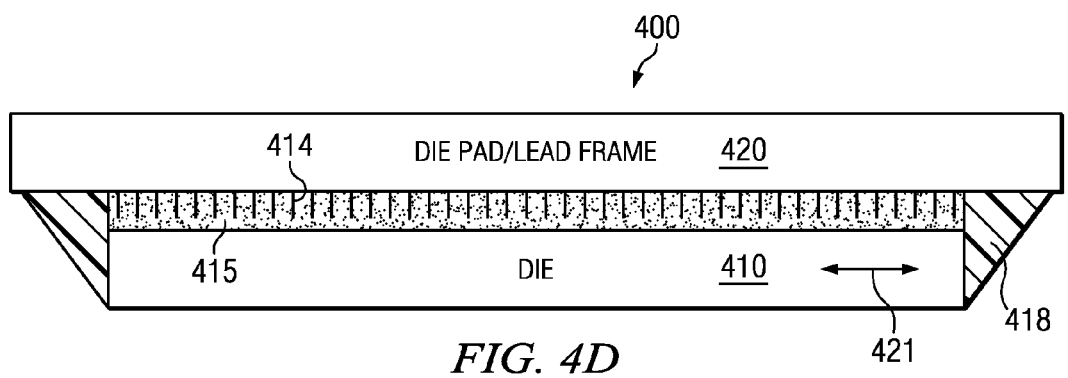

In FIGS. 4C and 4D, some other embodiments oppose die 410 and lead frame 420 so that CNTs 414 are on lead frame 420 above. The adhesive 415 is spray-misted up into CNTs 414 and provided as a liquid layer on lead frame 420 above. Die 410 is then brought into position and situated beneath. Then the process advances lead frame 420 so it descends toward die 410. Partial curing of adhesive 415 may be commenced or deferred until closure of the structure. As the lead frame with its CNTs 414 descends, the CNTs 414 penetrate the surface of the wet, uncured adhesive and remain with their lengths extended against die 410, thus defeating the thermal barrier skin effect of the adhesive 415 there. The adhesive 415 is cured to a flexible CNT-populated film (414, 415) joining the nearly juxtaposed die 410 and lead frame 420.

Figure 5:
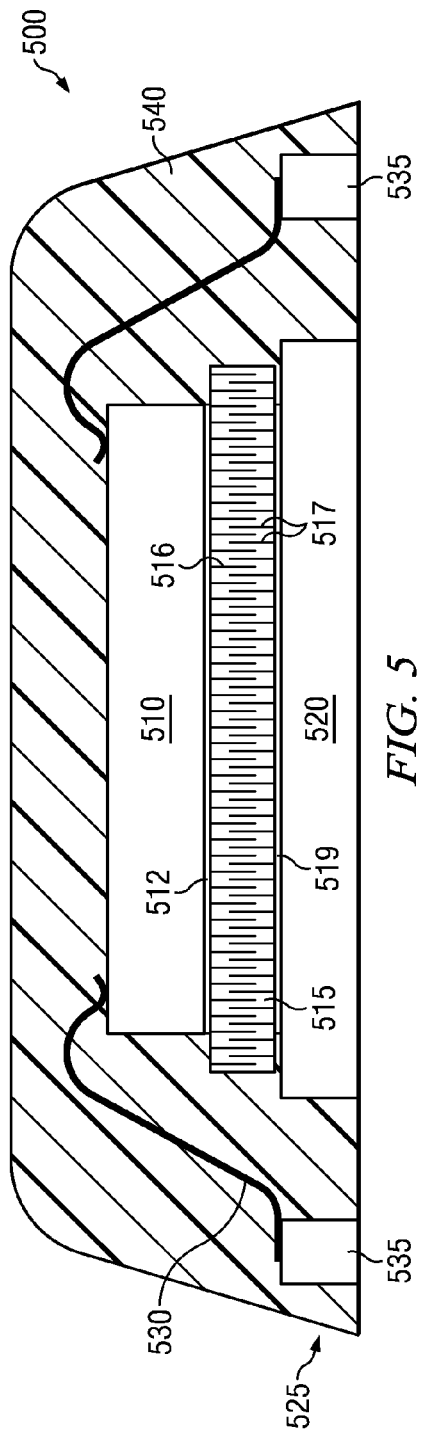
FIG. 5 is a cross section of another inventive structure having electronic package, an integrated circuit and a workpiece such as a die pad.

In FIG. 5, an electronic package 500 includes an integrated circuit IC die 510 bound to a die pad 520 by a CNT forest 516 grown from die 510 surface 512 and another CNT forest 517 grown from a surface 519 of die pad 520. A lead frame 525 originally provides the die pad 520 and lead pins 535 as shown in cross-section. For stronger plastic-encapsulation, subsequent injection molding of plastic onto the combination of lead frame 525, IC die 510, and die attach between them has physical affinity facilitated by surface roughness of the lead frame 525 and desirably some chemical affinity between the molding compound used and the metal finish of the lead frame 525. In FIG. 5, IC die 510 is flip-chip bonded as one example. Bond wires 530 couple bond pads disposed at locations on the topside of the IC die 510 to the lead pins 535. A plastic encapsulant 540 encapsulates IC die 510 and bond wires 530. Die attach adhesive 515 is densely populated with CNTs 516 grown from die 510 backside surface 512 and CNTs 517 grown from lead frame surface 519. Bond wires 530 suitably include one or more metals such as gold Au, copper Cu, tin Sn or otherwise and in some cases plated with copper Cu or aluminum Al or other material. IC die 510 in some embodiments has through silicon via (TSV) connections (not shown) for ground connections, I/O signal connections and/or power supply connections.

Some qualitative discussion of and approximate values for physical parameters of a grown CNT forest for use herein are described next. Parameters include thermal conductivity, thermal expansion, and flexibility. The thermal conductivity advantage of a grown CNT forest reduces or eliminates the thermal barrier skin effect of die attach adhesive 115, 215, 315, 415, and 515. This skin effect may be an effect of a resin layer that is used or associated with dispensed adhesives to form a bond with either the die or lead frame interface. The skin effect is responsible for thermal conductivity (and its converse, thermal resistivity) not being constant as a function of BLT and accounts for the difference in conductivity as between a thicker BLT and a thinner BLT.

Figure 12:
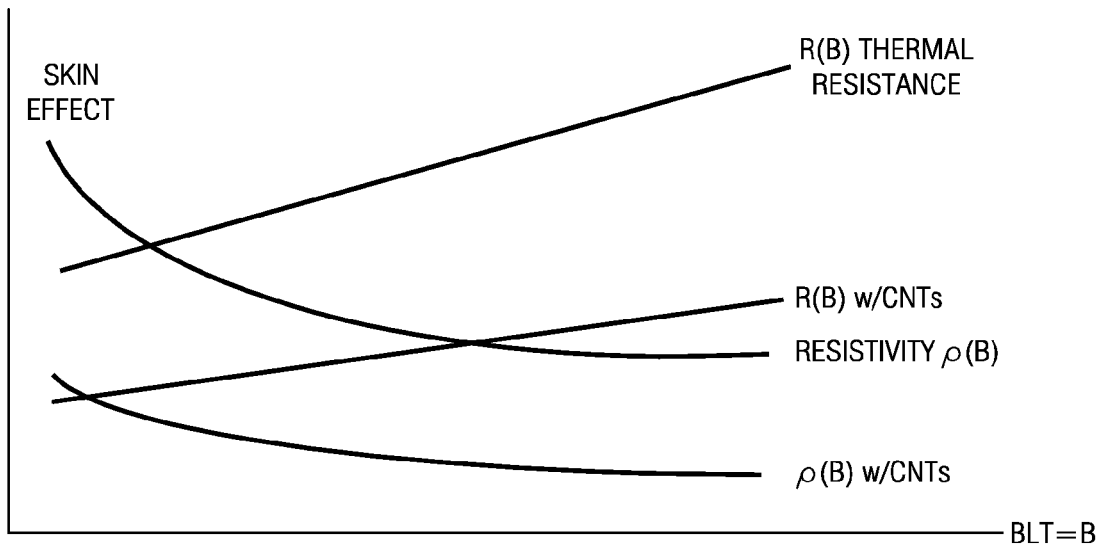
FIG. 12 is a first graph of thermal resistance of die attach adhesive versus bond line thickness BLT, and a superimposed second graph of resistance of the die attach adhesive versus BLT, see Appendix A.

See APPENDIX A and FIG. 12 for detailed description of how CNTs can reduce or substantially obviate this skin effect. In FIG. 12, the introduction of CNTs in the die attach reduces the overall resistivity ρ curve as a function of BLT=B and particularly ameliorates the skin effect at left. Further in FIG. 12, the introduction of CNTs in the die attach reduces the overall thermal resistance R curve as a function of BLT=B and decreases the slope of that thermal resistance R curve, which permits a somewhat thicker die attach if desired and therefore more flexible die attach that can resist thermal stresses and delamination better. Viewed another way, a CNT-based die attach of a given thickness BLT=B herein offers both more flexibility to resist thermal stresses and delamination and also higher thermal conductance (lower thermal resistance R(B)) than a comparable die attach without CNTs. The higher thermal conductance can reduce temperature rise in the chip relative to ambient temperature at a given operating power and thereby reduce thermal stresses as well.

Basically, each interdigitated embodiment of FIGS. 1A-1B or FIGS. 2A-2B or FIG. 5 grows CNT bristles as integral thermally conductive paths emanating directly out of both the die and lead frame surfaces, thereby penetrating or piercing the thermal barrier skin effect. Various single-sided CNT forest embodiments in FIGS. 3A-3B, 3C-3D, and 4A-4B also penetrate or pierce the thermal barrier skin by growth out of one surface or interface (of die or lead frame) and by making end-contact of CNTs to the opposite surface or interface (of lead frame or die).

In FIG. 5, when CNT forests 516 and 517 are grown from surfaces or interfaces 512 and 519 respectively, the limiting thermal transfer locations are between the CNTs 516 and 517 themselves. In this case the contact area between CNTs 516 and 517 is large since they are aligned parallel to each other. The excellent thermal conductivity (~3500 W/m-° K) in the CNT tube axis direction conducts the heat efficiently between the die 510 and lead frame 520. (Put another way, with 100 micron=$10^{-4}$ m CNT bristles occupying 1% of the backside area of a 1 $cm^2$=$10^{-4}$ $m^2$ area chip would be able to conduct as much as 35 watts of heat flow of dissipated power through the CNTs. And that is based on a die attach temperature rise of only 1° K. The silicon die itself would have its own larger temperature rise to thermally support that heat flow on the way to the die attach.) Lateral transfer of the heat between CNTs 516 and 517 takes advantage of the larger surface area along the length of the CNTs. This arrangement increases or maximizes the over-all thermal transfer between the die 510 and the lead frame 520. This improvement (elimination of skin effect at interfaces 512 and 519) is believed to not be possible with conventional dispensed adhesives with or without particulates such as silver Ag. An overall thermal conductivity improvement of about 200 W/m-° K at all BLT thicknesses is anticipated by introduction of CNTs in the die attach embodiments. See APPENDIX A for more description.

Average CNT bristle lengths L perpendicular from either IC die 510 substrate backside 512 or perpendicular from the lead frame 520 are in a contemplated range of about 5 to about 110 microns, although a shorter or much longer average length L may be useful in some embodiments. Considered another way, average length L is suitably set in a range between about 0.5*BLT (half the BLT) and about 1.1*BLT or higher, such as to about 2.0*BLT. Some grown CNTs in embodiments present themselves as microscopically cottony forests with bristles that may be other than perpendicular, such as non-perpendicular mats, which can also pierce the adhesive skin and provide dense thermally-conductive interfaces to die attach adhesive.

Bond-line thickness (BLT) values are in a contemplated range of about 2.5 (two and a half) microns to about 100 (one hundred) microns, and other values are contemplated as feasible as well. The BLT is somewhat related to a nominal CNT length which is contemplated in a range of 5 (five) to 110 (one hundred ten) microns. A thicker BLT in the range is used to reduce possibility of surface delamination from thermally induced stress by reducing the ratio (W*CTE*ΔT)/BLT noted earlier hereinabove. The range low end (5 microns) offers a short thermal conduction length and perhaps more uniform-length bristles in a shorter-duration CNT growth process and self-parallelizing placement of lead frame 510 with respect to substrate in the cured structure upon completed die attach. The BLT range higher end (100 microns, 0.1 mm) offers a beneficially-longer length of parallel bristle contact for double-sided interdigitated-bristle embodiments. Moreover, the range higher end (100 microns, 0.1 mm) offers a larger BLT for greater physical integrity due to the reduced possibility of surface delamination of the final cured structure employing either single-sided CNT forest embodiments or double-sided interdigitated-bristle embodiments, see FIG. 6. A BLT in the range of twenty-five to fifty (25-50) microns can provide a tradeoff between various process considerations, thermal considerations, and physical considerations discussed herein.

Figure 6:
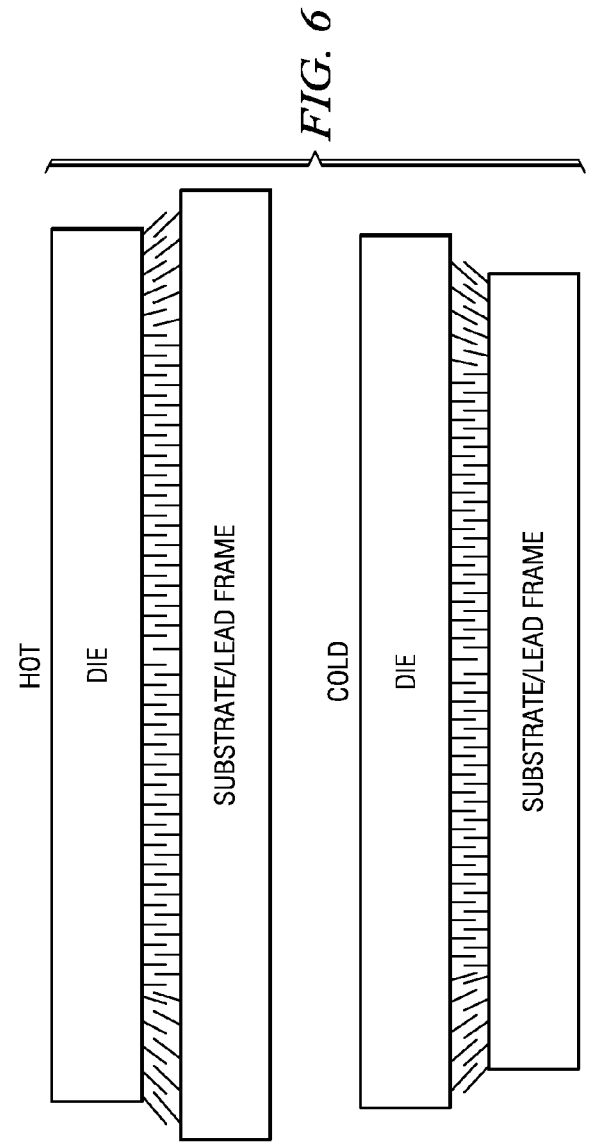
FIG. 6 is a pair of cross-sections of an inventive structure wherein the parts of the structures of other Figures are thermally stressed so that they expand and contract relative to one another with increased physical integrity and reliability.

In FIG. 6, grown-CNT assemblies like those of FIGS. 1A-5 provide improved resistance to delamination due to thermally induced stress. Concerning flexibility and thermal expansion, the coefficient of thermal expansion CTE of CNTs is similar to silicon, and is thus believed to pose no negative impact on the structure or system. Flexibility of the die attach is most desirable due to thermal expansion and temperature differences between the die 510 and the lead frame LF 520 (CTE of Si~3 ppm/° K and CTE of Cu~16 ppm/° K leads to difference of 13 ppm/° K, i.e. 13 parts-per-million per degree Kelvin). By orienting the CNTs 512, 514 perpendicular to the major axis in the plane of the die 510 and substrate 520, the anisotropic mechanical properties of the CNTs 512, 514 are in the most advantageous orientation for lateral flexing either under hot or cold conditions, as illustrated. Some physical bending or buckling at the CNT grown interface is expected and acceptable and remarkably allows desirable flexing, flexure and flexibility that relieves shear stress in this flexible die attach structure and reduces likelihood of die attach delamination notwithstanding physical shear angle A in radians, see Equation (1):

$$A = W*(CTE_{LF} - CTE_{DIE})*\Delta T/BLT. \quad (1)$$

Any crack propagation through the bulk adhesion layer 515 is also hindered by the high strength CNTs 512, 514. These benefits thus can reduce package-related Moisture Sensitivity Level (MSL) failure as well.

While FIG. 6 shows a double-sided interdigitated-bristle embodiment, it should be understood that the description of the flexibility benefits of an embodiment undergoing thermal expansion applies equally to single-sided CNT forest embodiments. Use of the word 'substrate' in FIG. 6 along with 'lead frame' indicates alternatives, such as a die pad of a printed circuit board (PCB) or a mounting slug or heat sink or chassis or other thermally conductive physical accommodation for the die attach may be used in some embodiments instead of a lead frame die pad. This use of the word 'substrate' in its context should not be confused with the distinct structural element provided by an IC wafer or die having a semiconductor substrate.

Figure 7:
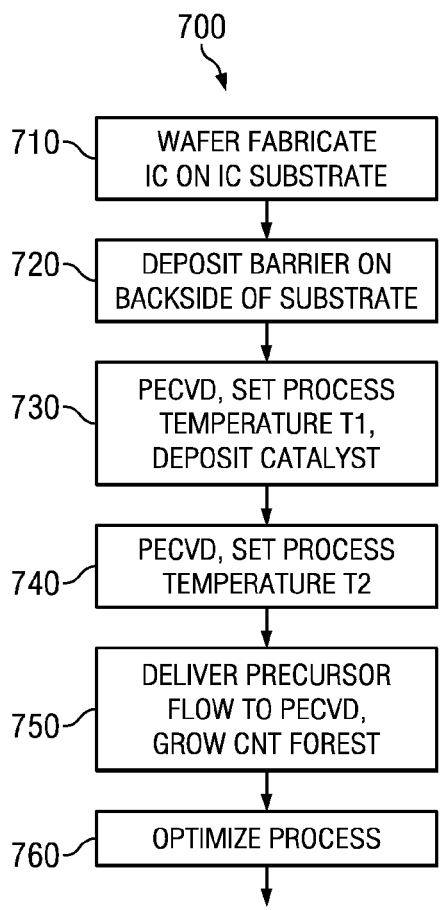
FIG. 7 is a flow diagram of a process embodiment for growing CNT on the backside of a semiconductor IC wafer for subsequent IC die attach according to FIG. 8.
Figure 8:
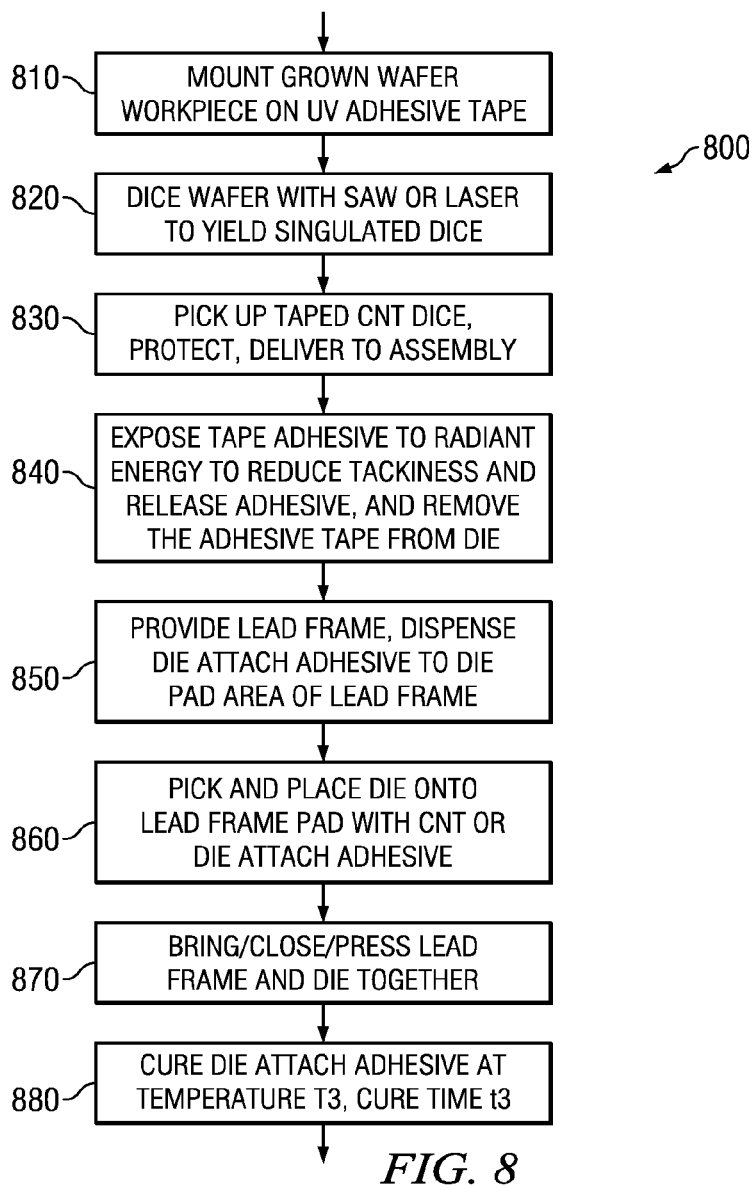
FIG. 8 is a flow diagram of a process embodiment of further steps for completing an IC die attach, after those in FIG. 7.

In FIGS. 7-8, with a view to process safety, the skilled worker sets up the process equipment so that it appropriately avoids, or minimizes and contains, any ancillary CNT dust or fibers at each process point, and applies removal such as by gentle vacuum where they may be present. Safe handling and delivery conditions should be arranged to safely isolate process chemicals and process dust, bristles or fibers from human contact.

In FIG. 7, a process 700 preferentially grows CNT bristles having high thermal conductivity. Moreover, the resulting structure robustly provides the desired thermal properties even when the grown CNT bristles may have a mixture of bristles with mostly-high and some lower thermal conductivities, or otherwise have imperfections in practical use. Various CNT die attach embodiments are made to have sufficient thermal conductivity to be an improvement over an equivalent thickness of die attach adhesive or resin.

In FIG. 7, a process embodiment for growing CNTs for die attach embodiments is detailed as follows:
0. Beforehand, a step 710 fabricates ICs on an e.g. silicon wafer, and a step 720 deposits or applies a titanium tungsten TiW barrier 125 (FIG. 1A) to the backside of the silicon wafer or substrate so that the silicon does not poison the upcoming CNT growth process. Backside barrier 125 growth is performed early enough in the wafer fab process so that any IC fab 710 process steps calling for a lower temperature are performed after barrier 125 growth. Barrier 125 is explicitly shown in FIG. 1A and implicitly present on the semiconductor substrate of other Figures without needing explicit illustration.

1. A step 730 sets up plasma enhanced chemical vapor deposition (PECVD) apparatus.
2. Step 730 further establishes initial process temperature T1 in a temperature range room temperature-to-500° C. for catalyst deposition.
3. Step 730 employs e.g. Co, Fe, Cu or Ni containing catalyst (cobalt, iron, copper, nickel) or optimized combination of such catalysts. Step 730 deposits the catalyst material on the barrier 125 layer, such as TiW, that was provided at step 720 on backside of silicon Si wafer or die.
4. Step 740 further establishes a CNT growth process temperature T2 in the temperature range room temperature-to-500° C. in preparation for CNT forest growth. Then step 750 grows the CNT forest with e.g. acetylene ($C_2H_2$), methane ($CH_4$), and/or ethylene ($C_2H_4$), (the foregoing hydrocarbons with carbon dioxide $CO_2$ as reactive gas or other appropriate oxygen containing precursor); and/or ethanol ($C_2H_6O$), methanol ($CH_3OH$), and/or cyclopentene oxide ($C_5H_8O$) as flowed precursors, with hydrogen and argon as reactive and dilution gasses respectively using a suitable delivery system to provide a range of flow rates in which to optimize the CNT growth. Precursor flow rates can range from 10 sccm to 500 sccm (standard cubic centimeters/minute), pressures up to or on the order of about one Torr in PECVD or up to about 1 atmosphere (760 Torr) in a thermal chemical vapor deposition process, and power levels for PECVD deposition and growth as appropriate for the size of the deposition system.
5. The above chemistries are used for optimization of the process at step 760 on test wafers by decreasing the temperatures T1 and T2 until an optimal lower pair of temperatures to support the process, and so that the process adequately controls the CNT material properties. The decreased or reduced temperatures are set low enough to preserve integrated circuit structures on the front side of the wafer while providing CNT die attach on the backside. Then the optimized process is applied to wafers in production according to steps 710-750.

Some background process literature is found in Magrez, A. et al. Low-Temperature, Highly Efficient Growth of Carbon Nanotubes on Functional Materials by an Oxidative Dehydrogenation Reaction. ACS Nano, 2010, 4(7), pp 3702-3708. See also Halonen, N. et al. Low-temperature growth of multi-walled carbon nanotubes by thermal CVD. Phys. Status Solidi B 248, No. 11, 2500-2503 (2011). See also U.S. Patent Application Publication 20100209696, "Anchored Nanostructure Materials and Method of Fabrication," dated Aug. 19, 2010, which is incorporated herein by reference.

At all points of the processing, the fab and A/T process flow protects the fabricated IC and its length of useful life physically and electrically.

For embodiments involving growth on a lead frame 120, 220, 320, 420, 520 of a CNT forest 114, 214, 314, 414, or 517, the lead frame is processed by a process that is simplified relative to FIG. 7 to A) clean the lead frame and apply process steps 730, 740, 750, 760 with the particular lead frame material (e.g. copper Cu).

Temperature and process time to grow the CNTs on the backside of an IC should be low enough to avoid disturbing the structures and anneals formed by wafer processing beforehand. The principal concerns are with the integrity of the silicon devices with respect to transistor contact stability and low-k dielectric/metal vias integrity with the upper bound of the temperature being dependent on the Si process node.

CNT Bristle density is suitably provided to achieve sufficient overall thermal conductivity of the die attach to keep the integrated circuit die from exceeding its rated temperature at expected electrical operating power and with manufacturer's recommended external mounting for the packaged IC chip and heat sinking if any. It is expected that growth of at least 1000 to 10,000 CNT bristles/sq-micron is desirable (although lower densities may be useful in some embodiments) and that the bristle density can feasibly and usefully be higher. Uniformity or randomness of grown-bristle spacing is not critical, and significant gaps or sparse areas of CNTs are generally avoided.

In FIGS. 1A, 2A, 5 and 6, bristles are grown on both the backside of the IC substrate and on the facing die attach side of the lead frame. In some of these embodiments, the average bristle length $L_1$ perpendicular from the IC substrate and the average bristle length $L_2$ perpendicular from the lead frame are grown substantially equal so that numerous bristles interdigitate along substantially their full lengths with their distal ends approaching the IC substrate or lead frame respectively. Complete uniformity of bristle length is not critical, and a small fraction of bristles that are longer than average accommodate themselves under gentle pressure when the IC substrate and lead frame are pressed together with a gentle applied force F.

At FIG. 7, step 750, the die attach structure is formed by a process that grows a CNT forest (or CNT mat herein) on the backside of the silicon wafer to have desirable properties of both electrical and thermal contact of the CNT mat with the wafer due to the growth. The CNT mat also has sufficient physical integrity to permit dicing tape ('blue tape') 150, 152 to stick to it and then be pulled off later. Growth from a properly prepared backside surface of the wafer suitably is arranged to occur at less than 425° C. to safeguard the integrated circuits on the front side of the wafer. Any of various catalyst substances, such as in solution for spin-on application or other types that may be prepared by other means (PVD, CVD, etc), for CNT growth may be used. This way the CNT die attach process is integrated into and made convenient for an overall chip manufacturing flow.

Figure 7A:
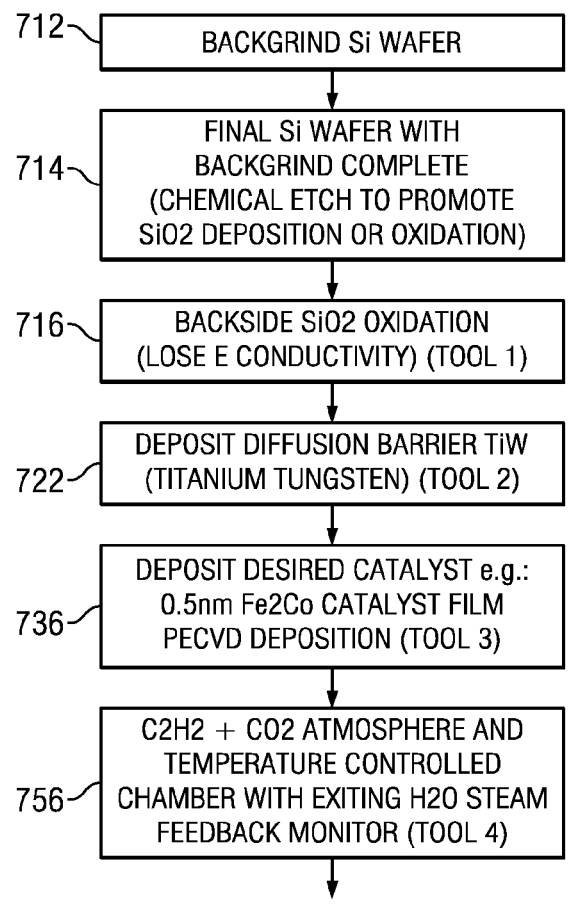
FIG. 7A is a flow diagram of additional details of a CNT growth-related process.

In FIG. 7A, a CNT growth process flow example is executed at low temperature, preferably 425° C. or less as in FIG. 7. The drawing numerals of FIG. 7A have their first two digits indicating each corresponding process step in FIG. 7 that is detailed in FIG. 7A and read together with FIG. 7. Thermal expansion performance of die attach is improved for greater flexibility to shear stress, and improved resistance to delamination of die attach. Growth on the backside of a wafer at low temperature maintains functional integrity of IC circuits.

In FIG. 7A, a step 712 backgrinds a silicon IC wafer to reduce its thickness and thereby increases its thermal conduction to the wafer backside from operationally heat-producing functional circuits fabricated beforehand on the front side Thinning the wafer also leads to very thin ICs that fit in electronic devices that call for a very thin form factor. At a step 714, the thickness of the wafer with backgrind complete may be of some suitable specified value such as in an example range 20 to 400 microns. Another way of describing the backgrind is a percentage value of reduction in wafer starting thickness, e.g., a percentage value in a range 30%-70% with other values possible. An optional wet chemical spin etch such as with nitric acid and/or hydrofluoric acid in a spin etch processor can further prepare the microscopic topology of the backside surface to promote catalyst adhesion followed by CNT growth. A succeeding step 716 executes backside oxidation of the silicon using a Tool 1 to lose or substantially reduce electrical (E) conductivity. Tool 1 is a suitable-size CVD or PECVD chamber.

A step 722 subsequently deposits a diffusion barrier (e.g., 300 nm titanium tungsten (TiW)) so that the wafer backside silicon Si and $SiO_2$ do not diffuse in subsequent processing and possibly poison CNT growth there. Step 722 uses a Tool 2 such as a CVD or other appropriate deposition system such as physical vapor deposition (PVD) chamber.

The steps 730, 740, 750 of FIG. 7 are executed. In connection with step 730, a step 736 in FIG. 7A executes chemical vapor deposition CVD of an approximately 0.5 nanometer (5 Angstroms) thickness of catalyst or growth-promoting film, such as ferro-cobalt $Fe_2Co$ metal film, ferro-cobalt-nickel FeCoNi metal film, titanium-tungsten TiW diffusion barrier film, or other metal film, composite metallic film, or other suitable film for CNT forest growth. For instance, a Tool 3 for the catalyst or growth-promoting film suitably is a spin coating chamber with a slurry of $Fe_2Co$ nano-particles. Agitation and evaporation of an alkaline water-solution of nitrates of iron Fe and of cobalt Co (2:1 Fe:Co, molar) is suitably used to form the slurry of ferro-cobalt $Fe_2Co$ on a diffusion barrier TiW film or copper Cu film on the backside of a semiconductor wafer 110.

In connection with step 750, a step 756 in FIG. 7A establishes an example atmosphere of acetylene $C_2H_2$ and carbon dioxide $CO_2$ in a range between 0.5:1 up to 2:1 molar ratio (<=2 moles $C_2H_2$ per mole of $CO_2$) with 1:1 molar ratio as a starting ratio for optimization at low temperature 400° C. Reaction proceeds in a temperature controlled chamber of a Tool 4 to which the catalyst film is exposed. Tool 4 is suitably a CVD chamber or chain diffusion furnace or quartz tube diffusion oven.

A steam feedback monitor for exiting steam ($H_2O$) is provided for Tool 4. The steam feedback monitor indicates the reaction rate and progress as the hydrogen from the acetylene $C_2H_2$ and the oxygen in the carbon dioxide $CO_2$ react together and are driven off as steam, leaving all-carbon growing in the form of carbon nanotubes CNT rooted to the diffusion barrier, e.g. TiW and/or $Fe_2Co$. A reaction time for completion of growth of a 5-110 nanometer, e.g. 20 nanometer, CNT forest this way can be approximately 1-to-15 minutes depending on low temperature and reactant parameters. Carbon monoxide (CO) may be a byproduct of the reaction in some quantity that depends on the process parameters, and any CO together with any exiting reactants should be safely disposed of.

The steam monitor is suitably coupled with the temperature control for the reaction chamber to adjust the temperature (within bounds) to control the reaction rate to a desired rate, and to terminate the reaction by cooling the reaction chamber and clearing the reactant atmosphere from the reaction chamber when the steam production falls below a predetermined level indicative of completion. Termination may also suitably be brought about by the apparatus when the steam monitor indicates a given number of moles of steam produced relative to the number of moles of acetylene that have been supplied to the reaction chamber for generating the intended weight of CNT forest or mat on the wafer(s) in the chamber. Argon Ar gas or other non-reactive gas may be used to clear the reaction chamber after a CNT growth run is completed.

An alternative process for growing the CNT forest deposits aluminum oxide $Al_2O_3$ and FeCoNi nano-particles on the backside of the silicon wafer 110. Nitrates of iron Fe, cobalt Co, and nickel (1:1:1 Fe:Co:Ni) are suitably used as precursors for the ferro-cobalt-nickel nano-particles. Then methanol $CH_3OH$ is introduced into the chamber and decomposed at around 400° C. to grow the CNT forest on the treated wafer backside. The low temperature is optimized so that the proportion of non-CNT carbon deposition, if any, from the methanol decomposition is moderate to small and so that such non-CNT carbon deposition is an acceptable concomitant with the die attach adhesive employed and the thermal performance to be obtained.

Turning to a die pad/lead frame 120 part of the final structure, a lead frame thickness may be on the order of 150 microns (e.g., copper Cu) with optional plating of nickel Ni on the order of 1 micron or less, palladium Pd on the order of 0.05 micron or less, and/or gold Au on the order of 0.005 micron or less; and silver Ag may also be present with or in the place of the gold Au at a thickness in the range of 0.01 micron or less. With some plated lead frames of this type, CNT forest processing temperature and time may be limited to a minute or less at 400° C. due to the plating on the lead frame because of possible risk to wire bonding and solderability. If process-sensitive plating on the lead frame is a consideration in selecting a particular CNT-based die attach embodiment taught herein, then growing a CNT forest on the wafer as in FIG. 7A can be a preferable embodiment without growing a CNT forest on the lead frame. Situating the CNT forest on the wafer backside can also be preferable due to IC unit density in wafer format. Available growth chamber size to accommodate the particular size of wafer, die, or lead frame can determine which process point is possible or preferable for growing the CNT forest.

For initial process verification, a silicon piece is put in a convenient chamber at 400° C. CNT is grown on the backside of the silicon piece at temperature in the machine according to the process flow. Growth of a thin black layer of CNT forest indicates intended growth on the backside of the silicon piece. Next the process applies blue tape (dicing tape) 150, 152 to the CNT-grown workpiece, and then exposes the blue tape on the CNT mat to UV before the tape is pulled off. The adhesive on a dicing tape commonly used for holding the wafer during sawing is UV sensitive. With this type of tape adhesive, the tackiness of the tape adhesive is greatly reduced after sawing and before physically picking up the sawed die such as by automatic machine. Then process verification tears the blue tape off. The process verification observes that the black layer of CNT essentially entirely remains on the silicon piece and almost none of it is torn off on the blue tape. Thus, the tape touching the CNT mat is satisfactory and beneficial for sawing and handling. The process thereafter applies die attach adhesive to the lead frame or die just before die placement/attachment to the lead frame.

One type of configuration thus avoids die attach adhesive application to the wafer back-side before sawing and thereby prevents production of an interface that may have potential for delamination during sawing. Deferring die attach adhesive application at that early point until later beneficially avoids unintended encapsulation of the free end (exterior or grown end) of the CNTs of the CNT mat that could subsequently limit heat transfer to a lead frame.

Alternatively, a particle-free adhesive (e.g., epoxy or particle-bearing epoxy centrifuged to remove the particles) is applied sparingly just after growing the CNT mat to physically stabilize the CNT mat next to the substrate before the blue tape is applied to the grown CNT mat. This alternative process is optimized to avoid encapsulating the CNT mat, and to verify that incidence of delamination during sawing is acceptably-minimal or nil. Thus, the CNT mat may be physically stabilized beforehand with a sparing amount of epoxy for it as well, or not, to extent that such physical stabilization is called for. Then die attach adhesive (e.g., epoxy) is subsequently applied to the lead frame, and die placement is executed.

In a process verification step at the assembly site, a syringe containing die attach adhesive (e.g., Ablestick 2815 commercially available from Henkel Co., Dusseldorf, Germany, or another suitable adhesive from TABLE A1 or otherwise) is provided. (If a silver-particle adhesive is provided, it can be spun in a centrifuge to agglomerate the silver at the plunger end of the syringe. A silver-particle-free epoxy is thereby obtained in the end of the syringe and the silver-free epoxy is applied to the die pad area of the lead frame prior to die placement thereon.) Production equipment such as a mounter machine 882 deposits the now-separated die attach adhesive to the lead frame and then places or attaches the die to the lead frame in the embodiment of FIGS. 3A-3B or FIG. 4A-4B, or 4C-4D.

Figure 8A:
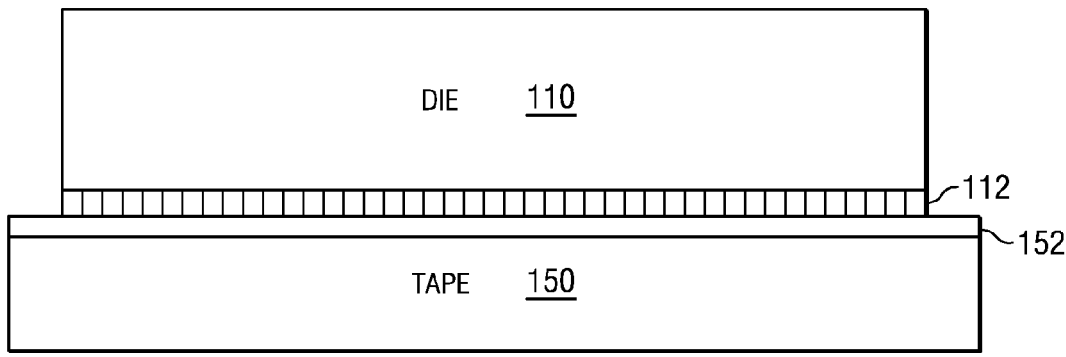
FIG. 8A illustrates a related singulated die.

Turning to detailed flow FIGS. 8 and 8A, a step 810 mounts the grown wafer workpiece, e.g. from FIGS. 7 and 7A, on adhesive tape 150 that has an ultraviolet-sensitive (UV) tape adhesive substance 152. Using step 810, the IC wafer backside with its grown CNT forest 112 adheres to the tape adhesive 152 of tape 150. The tape adhesive 152 is ultraviolet UV-sensitive or otherwise radiant energy sensitive (but not exposed to the UV until later). At a factory site step 820, the wafer (with CNT 112 and tape 150, 152 on backside) is laser-cut or sawed into die such as die 110. Sawing may be single-saw or dual-saw to singulate the die. Detached or damaged CNT bristles are washed away by the dicing saw, or are held as residue by adhesion of the dicing tape adhesive 152. Residual or stray bristles are thus removed or otherwise prevented from potentially introducing electrical shorts-failures or from wedging apart package elements (leaving a path for moisture entry and 'popcorn' package failure), or from contaminating assembly equipment.

A suitable pick-and-place die mounter such as with vacuum collet is used at a step 830 to pick and place the IC dice from step 820. The individual singulated die 110 with their tape 150 as illustrated in FIG. 8A are automatically picked up, mounted to a backing sheet, placed in a suitable protective material, carrier or wrap, and delivered in FIG. 8 step 830 to an assembly site for subsequent processing. The protection, physical transfer or delivery to the assembly site is readily maintained and/or arranged to protect the die and the already-relatively strong, resilient, taped CNT forest/mat from abrasion, and from objects having sharp points, corners or edges, and from sharp blows from other objects.

At the assembly site at a step 840, the tape adhesive "tack" 152 is released from CNT forest 112 by radiant energy exposure (e.g. UV). Such exposure may be applied before or after picking from a backing sheet, where such backing sheet is involved. In step 840, a mounter machine or a pick-and-place machine can be used to separate the singulated die 110 with CNT forest 112 from the tape 150, 152, whereby the die 110 get removed with CNT forest 112 intact.

Figure 10:
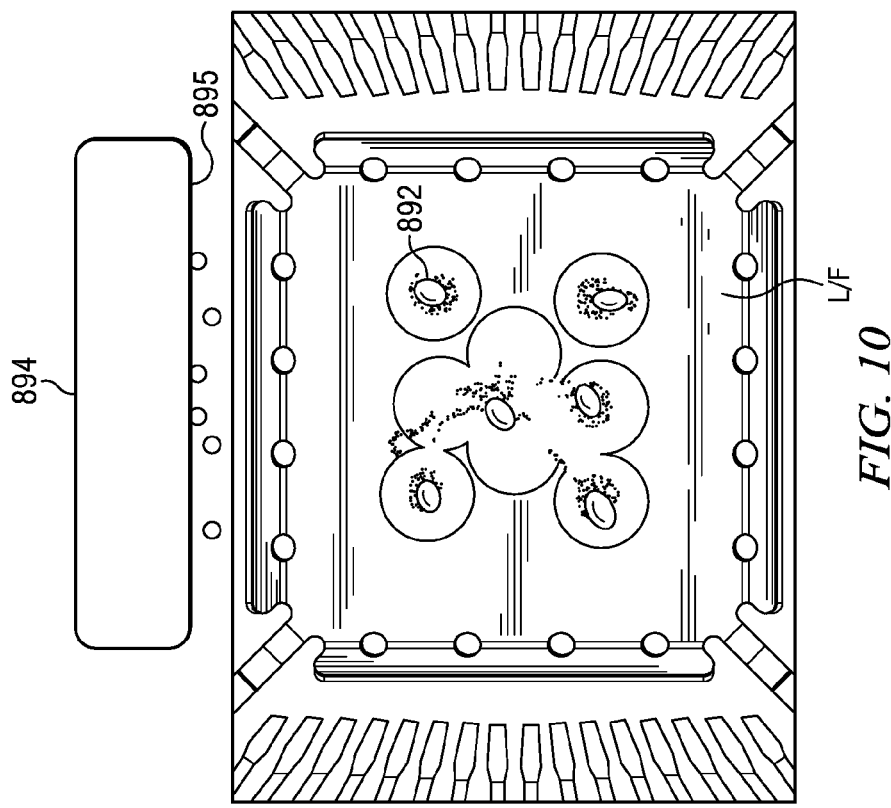
FIGS. 9 and 10 are each a pictorial of an inventive structure showing cured applied epoxy.
Figure 9:
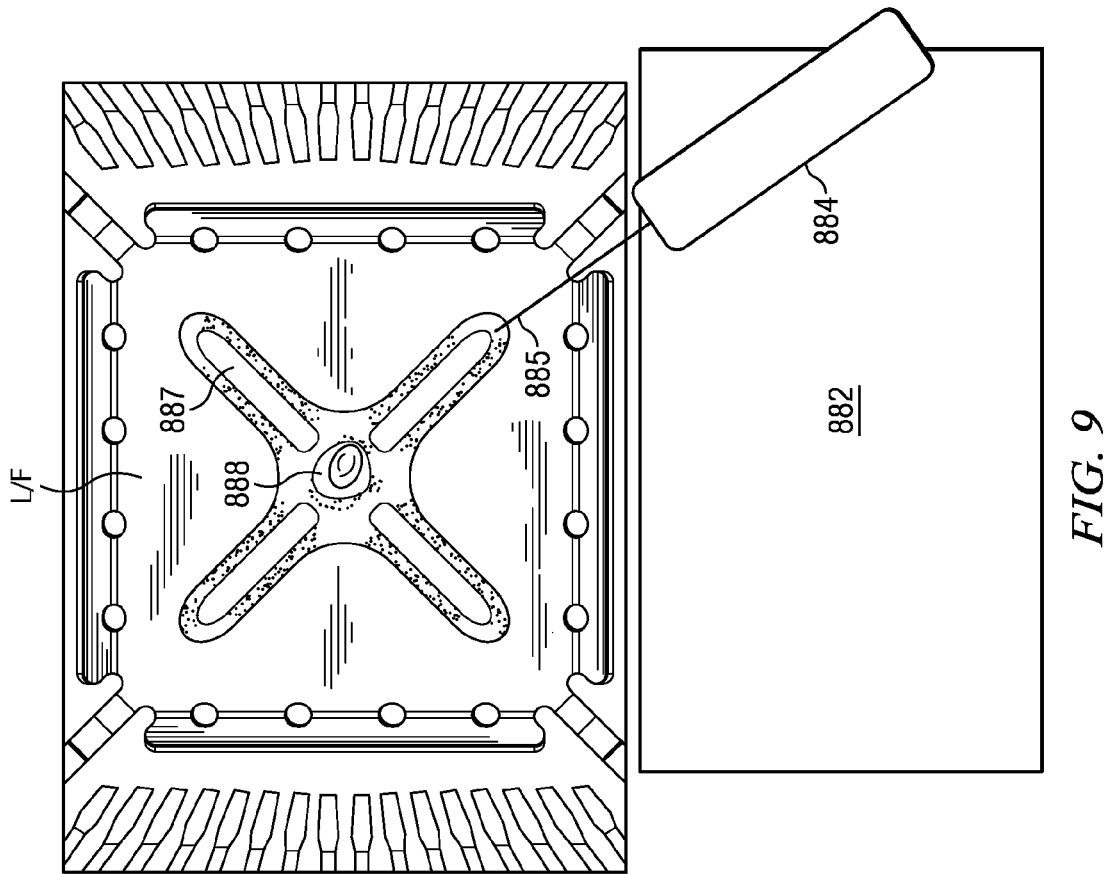

Also in FIG. 8, a step 850 provides a lead frame and dispenses die attach adhesive 115, 315, 415 or 515 onto the lead frame die pad (FIGS. 1A-5, with or without grown CNTs on the surface) and/or onto the IC die backside such as with CNT mat there. Dispensing of die attach adhesive is illustrated in FIG. 9 or FIG. 10 and discussed in more detail hereinbelow. In FIG. 9, this is suitably done using a dispense syringe 884 with its needle 885 as applicator. The amount of die attach adhesive dispensed (as well as any motion of the needle 885) is programmed into a die mounter machine 882 for instance. The die attach adhesive can be epoxy, BMI (bismaleimide), acrylate, or a mix of these chemistries, or otherwise suitable material. BMI and acrylate are believed quite desirable due to low viscosity even relative to epoxies. Bismaleimide refers to a monomer imide that thermosets without giving off volatiles. Filler materials in the die adhesive are not necessary but may be optionally used in the die attach adhesive in some embodiments, see e.g. FIGS. 11A-12B later hereinbelow.

In FIG. 8 step 850, the needle 885 or shower/spray head 894 suitably does not touch the CNTs, and the dispensed die attach adhesive is of low viscosity effective for wetting the CNT mat whether on die, die pad or both. Capillary action and wetting pull the adhesive between the grown CNTs 112 and/or 114 to get the die attach adhesive fully distributed into and among the CNT bristles and avoid dislodging bristles from the surface(s) upon which they are grown. For instance, step 850 can be arranged to also spray the mat of carbon nanotubes 112 on the backside of die 110 with some die attach adhesive prior to the performing of pick-and-place against dispensed die attach adhesive on a die pad/lead frame 120 (320).

In FIG. 8, pick-and-place is then performed in a step 860 for a die attach step 870. Step 860 picks and places an IC die onto a die pad. The CNT mat(s) and site of dispensed die attach adhesive may be already prepared in a manner suited to the selected configuration of any of FIGS. 1A-5. In step 870, the die 110 and lead frame die pad are brought near and almost into contact, and with the die attach between them including grown CNTs in a layer of die attach adhesive joining and adhering with the opposing surfaces of the die 110 and lead frame die pad. In other words, upon the uncured die attach adhesive being distributed uniformly in step 850, the process proceeds to bring, close, and/or gently press the opposing surfaces of IC die and lead frame into juxtaposition to adhere to each other with the CNT mat or forest therebetween.

In one example of orientation, this closure motion of step 870 can involve a vertical motion for placement of the die on the die pad, so that the broad sides or surface planes of the die and die pad have generally horizontal orientation and are moved closer relative to each other along a vertical direction perpendicular to the horizontal planes. If both die and die pad have grown CNTs, the CNTs are suitably caused to contact each other interstitially lengthwise along bristles, nano-hairs, nano-fibers or threads of carbon nanotube CNT material that are approximately perpendicular to and occupy a space between the parallel surface planes of the die and die pad.

One desirable amount of overlap of interdigitated CNTs is about $x=\frac{2}{3}$ of their length L, i.e., bristles interdigitating lengthwise parallel with bristles so that if the bristles are L=30 microns long, the bristles overlap 20 microns out of that 30 microns, and BLT B=40 microns. See APPENDIX B for a generalized description. At step 870, for interdigitated-bristle embodiments, the bristles thus do not mash down but instead interdigitate e.g. about $x=\frac{2}{3}$ with each other automatically, as the place operation of steps 860-870 brings the die and die pad into close juxtaposition. Capillary action spreads the liquid adhesive from the die pad CNTs 517 to the die CNTs 516 in those embodiments in which CNTs are used on both die and die pad. Otherwise, capillary action spreads the liquid adhesive from the CNTs from whichever surface they overlie to the opposing juxtaposed surface close nearby.

In some other embodiments, a lateral vibratory motion of appropriate frequency and amplitude may be applied to assist the interstitial dispersal or facilitate uniform dispersal. Vibration and/or rotation may also be suitably used to facilitate the CNTs standing up and touching as they are pressed together in those embodiments that have two opposing CNT forests. However, at the short CNT bristle lengths used in some of the examples herein, special slight vibration or any lateral motion to assist interdigitation is believed optional or unnecessary.

The die/die pad assembly is then cured at step 880 to complete the die attach, and made ready for wire bonding or other next assembly process step. At this point, the opposing surfaces are maintained in close juxtaposition and adhere to each other due to curing of the die attach adhesive. At step 880, a suitable curing temperature T3 and cure time duration $t_3$ of an epoxy die attach adhesive is illustratively 175 C for 30 minutes, and cure parameters will vary depending on the material(s) of the die attach adhesive to be cured.

The wire bonding and packaging are subsequently completed. For a plastic package, for instance, mold compound is injected in a molding machine to surround the integrated circuit and die attach and at least part of a die pad as in FIG. 5. In subsequent device or system manufacture, the die pad can be mounted to further support such as a slug, mounting surface, printed wiring board, and/or heat sink. "Die pad" is used herein to broadly signify various alternatives, such as a die pad portion of a lead frame, or a slug, heat sink, printed wiring board, or other mounting surface that the die attach abuts. Accordingly, in some other embodiments the integrated circuit and die attach may be alternatively affixed to any of these various forms of die pad.

In FIGS. 9 and 10, a broadside view of one example of packaged die-mounted improved chip has the lead frame L/F in an array, like a QFN (Quad Flat No leads) format lead frame. The wafer is delivered to the assembly site diced, on tape, from the wafer fab or other site of die sawing. The QFN format lead frame array and its physical relation to die/CNT/die pad are depicted in cross-section for various embodiments in several of the Figures herein.

In FIG. 9, a pictorial of pen write deposition herein shows uncured die attach adhesive deposited as four pen-written lines 887 of adhesive and a central mound or droplet 888, which are collectively beginning to distribute uniformly over the die pad of lead frame L/F. Upon being distributed uniformly, the process proceeds to bring opposing die/die pad surfaces into closer juxtaposition to adhere to each other with a CNT forest therebetween. A pen write dispense head 884 (syringe) is provided on and operated by a motorized programmable mounter machine 882. Dispense head 884 uses a needle-shaped tube 885 (needle) with a single hole, and the uncured adhesive 887, 888 is drawn in a pattern that assures uniform coverage of the adhesive over the die pad as the adhesive distributes itself. FIG. 9 shows an example dispense pattern "X" to optimize spreading of the adhesive to the die corners upon closure.

In FIG. 10, an illustration of shower head dispensing herein includes a pictorial of uncured die attach adhesive deposited as several droplets 892 or mounds that are beginning to distribute uniformly over a die pad of a lead frame L/F. This dispensing process is alternative to the pen write dispense process of FIG. 9. A shower head dispense head 894 is provided on the mounter machine and has one or more holes that are used to dispense the adhesive in drops (either as drops or alternatively by formation of drop-like areas by a briefly-sustained stream as the 'shower.'). If a CNT forest is present, the dispense nozzle 895 of dispense head 894 is suitably held above the level of the CNTs, and only the dispensed liquid comes in contact with the CNTs as the dispense process occurs. FIG. 10 shows an example shower head dispense pattern (on standard die pad) as, e.g., a six-dot (6) shower head dispense pattern. This shower head dispensing process can beneficially support high-speed assembly with controlled volume dispense.

APPENDIX A

CNT Reduction of Thermal Barrier Skin Effect

Skin effect reduction in conductivity (electrical or thermal) with thinner BLT's and corresponding decrease in resistivity with thicker BLTs, is evident in the examples in TABLE A1. FIGS. 5 and 12 are used for reference, and embodiments of other Figures herein may be described analogously.

TABLE A1

| | SKIN EFFECT* | |
|---|---|---|
| ADHESIVE | BLT (B, microns) | RESISTIVITY ρ (R/B uΩ · cm) |
| Ab 878-1 | 8 | 475 |
| | 40 | 250 |
| Ab 3131A | 5 | 270 |
| | 22 | 150 |
| | 52 | 50 |
| Ag ATLF61-1 | 25 | 175 |
| | 45 | 140 |
| H QM1529-HT | 5 | 190 |
| | 25 | 75 |
| | 45 | 50 |
| L MD140 | 15 | 155 |
| | 75 | 110 |

*(Values are approximate, Ab = Ablestick, H = Henkel, L = Lord, Ag = Aguila)

For example, Ab 878-1 adhesive at BLT equal to 40 microns or more has a conductivity of 4000 mho/cm corresponding to its resistivity of about 250 uOhm-cm. (Conductance mho is analogous to Watts/° K, and sample conductivity (or resistivity) is the conductance (or resistance) value of the sample at each tabulated BLT normalized to unit area and unit length.) At an 8 micron BLT the conductivity of the same adhesive falls to about 2100 mho/cm corresponding to increased resistivity 475 uOhm-cm. See resistivity curve in FIG. 12.

The 225 uOhm-cm increase in resistivity is due to the skin effect at each of i) the lead frame interface 519 with adhesive 515 and ii) the die interface 512 with adhesive 515 (about 112 uOhm-cm each). A grown CNT forest will have little or no skin effect when intimate contact is made between the CNT forest and the opposing surface. The expected improvement with a grown CNT for that adhesive is probably between about 100-112 uOhm-cm per interface (512 or 519) from substantial reduction or elimination of the skin effect.

More generally, resistivities are expressed by Equations (A-1) and (A-2) for a sample material acting like a sandwich of layers consisting of a first skin thickness $l_0$, an intermediate portion having middle dimension $l_1$ (or $l_2$ depending on BLT), and a second skin thickness $l_0$. The skin layers have computed resistivity $\rho_S$, and the intermediate portion has computed resistivity $\rho_M$. Tabulated values of resistivity $\rho_1$ or $\rho_2$ have corresponding per-unit-area resistances $R_1 = \rho_1 B_1$ and $R_2 = \rho_2 B_2$ for lower and higher BLT values $B_1$ and $B_2$ for a given material in TABLE A1.

$$2l_0 \rho_S + l_1 \rho_M = R_1 \quad (A\text{-}1)$$

$$2l_0 \rho_S + l_2 \rho_M = R_2 \quad (A\text{-}2)$$

The BLTs are related to the sum of the skin thicknesses plus the middle dimension:

$$2l_0 + l_1 = B_1 \quad (A\text{-}3)$$

$$2l_0 + l_2 = B_2 \quad (A\text{-}4)$$

Because middle dimension $l_1 >= 0$ and skin thicknesses $2l_0$ cannot exceed BLT $B_1$, inspection of Equation (A-1) indicates that skin resistivity is at least as high as the resistivity $R_1$.

$$\rho_S > R_1/B_1 \quad (A\text{-}5)$$

Subtracting Equation (A-1) from (A-2) and also subtracting Equation (A-3) from (A-4) leads to the resistivity $\rho_M$ of the intermediate portion in Equation (A-7):

$$l_2-l_1=(R_2-R_1)/\rho_M=B_2-B_1 \quad (A\text{-}6)$$

$$\rho_M=(R_2-R_1)/(B_2-B_1) \quad (A\text{-}7)$$

The actual resistance R (per unit area of chip) of a die attach adhesive versus any BLT value B then is expressed in (Equation A-8) as the BLT value B multiplied by resistivity expressed by adapting (Equation A-2). Where TABLE A1 lists a resistivity R for a thickness under 10 microns, the skin resistivity $\rho_S=R_1/B_1$ is assumed for approximation. The overall resistance function R(B) as in FIG. 12 is basically a rising straight line—a linear interpolation or extrapolation based on the tabulated values.

$$R=R_1+(R_2-R_1)(B-B_1)/(B_2-B_1) \quad (A\text{-}8)$$

If no skin effect were present, then $\rho_S=\rho_M=\rho$ (a constant resistivity) and substituting Equation (A-3) into Equation (A-2) yields R=B $\rho$, as would be expected, and the resistance R(B) line passes through the origin (0, 0) of a graph. But with skin effect, the straight line resistance function is shifted upward from the horizontal BLT axis and the intercept is no longer at the origin, resulting in a declining resistivity as a function of BLT and as reflected in TABLE A1. With skin effect the estimated resistivity $\rho(B)$ as a function of BLT is Equation (A-8) divided by variable B for BLT. In FIG. 12, the resistivity declines asymptotically from the skin resistivity toward the lower resistivity $\rho_M$ of the intermediate portion of the adhesive.

$$\rho(B)=R/B=(R_1/B)+[(R_2-R_1)(B-B_1)/(B_2-B_1)]/B \quad (A\text{-}9)$$

In the particular adhesive example of Ab 878-1, its tabulated resistivities indicate a skin resistivity $\rho_S$ of at least 475 u $\Omega\cdot$cm and a resistivity $\rho_M$=194 u $\Omega\cdot$cm from Eq. (A-7).

Adding CNTs would consequently pierce the higher-resistivity skin layers and use the adhesive conductivity more effectively for thermal transfer as well as bypass the adhesive somewhat and provide direct thermal transfer as well.

The CNTs are unlikely to fully cover (C=100%) the surfaces on which they are grown. If the CNTs are perfect cylindrical tubes, they provide an thermal admitting surface having a circular area $\pi r^2$, and a cylinder body surface $2\pi rL$ where L is their length. Accordingly, even if the CNTs have a coverage C<<100% and terminate in the adhesive and not at the opposite surface, they provide an area expansion factor $2\pi rL/\pi r^2=2$ L/r for laterally delivering heat to or absorbing heat from the adhesive medium. CNTs are very long compared to their radius, on the order of 1000's of times or more. For example, suppose the CNTs have bristle length 10 microns and virtually zero resistivity, 1 nanometer diameter and average growth spacing 10 nanometers ($10^4$ CNT bristles/micron$^2$). The coverage ratio C is about 0.8% (i.e. $(\pi/4)\,1^2/10^2$)). The area expansion factor 2 L/r=40,000 more than makes up for the low coverage ratio C. Even if every CNT bristle encounters skin effect resistivity at its cylindrical surface in the interior of the die attach adhesive, the amount of area that it is presenting provides a very much reduced low thermal resistance to the adhesive medium even though the skin resistivity itself is higher than that of the adhesive medium. Thus, the main description herein contemplates a substantial overall thermal conductivity improvement at all desired BLT thicknesses by introduction of CNTs in the die attach embodiments.

APPENDIX B

Interdigitated Bristles

Given a bond line thickness BLT=B, and overlap length Bz or fraction z of BLT=B, and respective lengths L1 and L2 of opposing sets of interdigitated bristles as in FIG. 1B, FIG. 2B or FIG. 5, the following relationships are noted:

$$B=L1+L2-Bz \quad (B\text{-}1)$$

$$B=(L1+L2)/(1+z) \quad (B\text{-}2)$$

$$z=(L1+L2)/B-1 \quad (B\text{-}3)$$

$$L1+L2=(1+z)B \quad (B\text{-}4)$$

If L1=L2=L, for equal length CNT forests, the overlap length is xL=Bz, and so $$z=x(L/B). \quad (B\text{-}4A)$$

For a numerical example, an bristle overlap ratio x=⅔ of a bristle length L=¾ B leads to an overlap z relative to BLT of z=⅔×¾, or about 50% (one-half).

The BLT is approximately given by $$B=(x+2(1-x))L=2L-xL=(2-x)L. \quad (B\text{-}5)$$

Conversely, given a bristle length L and a BLT exceeding L, the overlap fraction x is approximately given by:

$$x=2-(B/L)=(2L-B)/L \quad (B\text{-}6)$$

Alternatively, when the intended BLT and the overlap fraction x can be known, and then the bristle length L for a CNT forest to be grown is approximately given by:

$$L=B/(2-x) \quad (B\text{-}7)$$

In FIGS. 11A-11D for a process and structure embodiment 900, a self-healing polymer composition is provided in combination with CNTs for high thermal conductivity, reduced die attach temperatures, and self-healing resistance to delamination and cracking, thus increasing reliability. Self-healing monomer and catalyst microspheres are distributed and then compressed and polymerized to result in a die attach comprised of the highly thermally conductive CNTs and self-healing polymer. For some background on microcapsules, see U.S. Patent Application Publication 20100264553 (TI-67448) "Packaged Electronic Device Having Metal Comprising Self-Healing Die Attach Material" dated Oct. 21, 2010, which is incorporated herein by reference in its entirety.

In FIGS. 11A-11D, a structure and process embodiment 900 proceeds as follows.

STEP (1): At a wafer fab site, a Step (1) grows CNTs 912 on wafers 910 on a side opposite the integrated circuitry side of those wafers 910, as in FIGS. 7 and 7A.

STEP (2): In a Step (2), IC die are singulated from the wafers 910 onto backing tape. Notice that the tape may acceptably touch the CNTs 914. Operations proceed analogous to FIG. 8 and as more specifically described for FIGS. 11A-11D here.

STEP (3): At the assembly/packaging/test site, in the meantime, uncured adhesive including microcapsules in the adhesive is delivered and stored, e.g., in a refrigerated condition, at the assembly site. This way, a mixture of uncured adhesive and microcapsules is provided as a die attach precursor while conveniently using conventional assembly equipment. The uncured adhesive is a mixture ready for curing in assembly. The microcapsules in one example are of two types, such as monomer and catalyst respectively, some of the microcapsules will rupture in assembly and others at least in part survive and not rupture in assembly. These materials are described in further detail later hereinbelow. In FIG. 11A, Step (3) dispenses the refrigerated uncured adhesive and microcapsules together as a shower of uncured die attach adhesive 915 and microcapsules 916, 917 onto a bare lead frame 920. (In some other embodiments the lead frame 920 can have grown CNTs thereon.) The showering process distributes itself as a layer die attach adhesive 915 on the die pad portion of the lead frame 920 as a dispensed bond line. In the shower, the microcapsules like 916, 917 are distributed in and on the area of layer 915. Such distribution can conveniently be approximately uniform, but some non-uniformity may be optionally introduced to the extent that it facilitates the die attach or is found to improve self-healing such as perhaps around the periphery of the later-cured die attach adhesive 915.

STEP (4): In FIG. 11B, a further Step (4) executes pick-and-place of singulated die 910 and brings such die into registration near the lead frame 920 and its dispensed bond line. At this point, a variety of sizes of microcapsules 906, 907, 916, 917, etc, are in or on the uncured die attach adhesive 915. In FIG. 11C, the die 910 is advanced with its grown CNTs 914 relative to lead frame 920, and the CNTs 914 penetrate and are wetted by the uncured die attach adhesive 915.

STEP (5): Operations in FIGS. 11C-11D continue and proceed with a Step (5) that applies a gentle force 924 to press the CNTs 912 into and among the microcapsules 906, 916 and die attach adhesive 915, and to thermally contact the CNTs 912 on the backside of die 910 against and onto the lead frame 920. In FIG. 11C, the Step 5 force 924 ruptures some or most of the microcapsules such as microcapsules 906 and 907 that have different contents that chemically interact. In FIG. 11D, void spaces are closed up by die attach adhesive 915 and by reaction of contents of rupturing microcapsules such as microcapsules 906 and 907 so that die attach adhesive 915 engages both die 910 and lead frame 920 adjacent and in substantial broadside juxtaposition. The grown CNTs 912 achieve thermal contact with both die 910 and lead frame 920 as well. The walls of the ruptured microcapsules may be mostly dissolved or may leave some acceptable residue depending on their chemistry. For some embodiments, microcapsules 906, 907 are selected to have a diameter value in a range roughly 1.5-to-3 times BLT, see APPENDIX C.

STEP (6): A step (6) completes curing of the adhesive 915 during a curing time interval so that the grown CNTs 912, die attach adhesive 915 and unruptured microcapsules (such as microcapsule 916) form a cured, integral mass that bonds and firmly holds, affixes and thermally couples the die 910 and lead frame 920 to each other.

Upon completion of Step (6), the unruptured microcapsules include the e.g. two types, such as monomer and catalyst respectively, and they can survive assembly and later beneficially rupture under thermal stressing of the die attach adhesive and promote the remarkable self-healing the die attach adhesive. For example, some of the microcapsules may rupture and perform self-healing on cool-down if an elevated cure temperature is used, or as a result of thermal excursions up or down of temperature in a plastic molding assembly process. In that case, the microcapsules are provided in appropriate amounts and variety so that a desired fraction do survive the whole assembly process unruptured. That way, the desired fraction of the microcapsules can be present and available to rupture minutely here or there in the die attach adhesive to promote subsequent self-healing if and when subsequent thermal excursions occur and stress one or another particular point in the die attach adhesive during and between powered functional operations of the IC chip.

An IC die 910 is thus mounted on a die pad e.g. of a lead frame 920 using a die attach adhesive 915 for mechanical attachment and employing a remarkably-enhanced, CNT-based thermal pathway to the die pad. The die attach adhesive 915 is e.g. a polyimide or epoxy based adhesive or other suitable adhesive that results from reaction of different chemical contents of microcapsules such as 906 and 907. Microcapsules 906, 907 can differ from each other by including jointly-active precursors for making more die attach adhesive and healing die attach adhesive. Microcapsules can vary in size, and include smaller illustrated microcapsules 914, 916 that survive assembly. Examples of useful flowable polymerizable material for die attach adhesive (and for the microcapsule contents) include monomer resins for forming epoxies, urethanes, silicones, polyimides, polyesters, organosilicon polymers or other desirable die attach substances. These curable resins respond to their corresponding catalyst and cure into moisture-resistant and adhesive die attach materials.

The microcapsules suitably have the form of hollow microspheres, microbubbles or microballoons, and have solid, rupturable walls or shells ranging in average diameters between e.g. about five (5) and about one hundred ten (110) microns and enclosing liquid contents. The microcapsule wall thickness(es) can be selected as one or more values that are in a thickness range, e.g. between about 0.5 micron and about 11 microns, is sufficient to prevent premature wall rupture until subjected to compression by force 924 or subsequent thermal stresses, but thin enough to rupture when thus compressed or stressed. The wall thickness can be a small fraction of a diameter value in the diameter range or in a range of fractions about 0.005 (one-half percent, ½%) to about 0.1 (or 10%, one-tenth) of the diameter. Also, some feasible embodiments can lie outside these example range values given for diameters, thicknesses and fractions. Microcapsule walls suitably are any of hydrous metal oxide, silica, borosilicates, silicate type sol-gel precursors, carbon, or polymers such as urea-formaldehyde, phenolics, or other suitable materials.

In addition, small amounts of solvents that are chemically inert relative to the polymerizable material and the polymerization agent may be included in the microcapsules to help flow the polymerizing material after microcapsule rupture. The flowable polymerizable material polymerizes after rupture leaving some further self-healing polymerizable material that has a viscosity and flow at the expected operating temperature of the electronic device in use. In this way, the die attach material is endowed with the remarkable self-healing property while the CNTs substantially contribute and conveniently confer beneficial thermal conductivity and flexibility as in FIG. 6.

In FIG. 11C and Step (5), the compressive force 924 is applied to the layer of microcapsules and CNTs and can rupture some of the microcapsules. Compression is suitably established using a press mechanism or alternatively operating a ultrasonic transducer to temporarily couple and apply ultrasonic energy through the lead frame into the die attach adhesive layer 915. The compressive force ruptures at least a portion of both sets of microcapsules concurrently or in any order, releasing flowable polymerizable material and catalyst to form a CNT die attach that secures the IC die 910 to the top surface of the lead frame 920. In one example formulation, a fraction of the microcapsules are not initially ruptured, e.g. one volume percent (1 vol. %) to five volume percent (5 vol. %) inclusive, and subsequently confer self-healing in case the die attach is stressed to a point of risk of delamination or cracking. In another example formulation, a volume fraction $x = V_{UNRUPTURED}/(AB)$ of microcapsules are not initially ruptured in the cured die attach volume AB, e.g. one volume percent (1 vol. %)$<=x<=$five volume percent (5 vol. %) inclusive, and they subsequently confer self-healing in case the die attach is stressed to a point of risk of delamination or cracking.

FIG. 11D illustrates an embodiment including self-healing die attach adhesive 915 that has CNTs 912, first microcapsules 916 having a flowable polymerizable material inside them, and second microcapsules 917 having at least one polymerization agent inside them and effective for inducing polymerization of the flowable polymerizable material to form a polymer upon rupture of some of both the first and second microcapsules 916, 917. The polymer fills, binds or holds together spaces and stress-flaws in the self-healing die attach adhesive 915 together with CNTs 912, and the rest of first microcapsules 916 and second microcapsules 917. During assembly, applied force 924 ruptures a portion, but not all, of the first microcapsules 916 and a portion likewise of second microcapsules 917 to form some of that polymer.

Alternatively, some process embodiments grow CNTs 414 on the lead frames 920. Spray-application of uncured polymer 915 with microcapsules then proceeds, or microcapsules like 916, 917 are dusted onto the uncured polymer 915 where they remain.

A powder including A) microcapsules of monomer and/or oligomer and B) microcapsules of polymerization catalyst can also or alternatively be distributed approximately uniformly onto and among CNTs. Spraying, or fluidized bed application processes may apply the microcapsules in and with a solvent to aid in patterning and dispensing.

In yet another assembly process based on FIGS. 11A-11D, die 910 is oriented with CNTs 912 face up and grown on the die 910. After delivery of die to the assembly site, distribution of the microcapsules dusts them as a powder on and among the CNTs 912. Then, like FIGS. 3A-3B upside-down, a lead frame having uncured die attach adhesive is lowered onto the CNTs 912. Contemporaneous vibration of the workpiece at hand, e.g. by ultrasonics, optionally assists uniform distribution of the powder or solvent mixture among the CNTs 912 whether the CNTs 912 are grown on the die 910 or the lead frame 920 or both. The microcapsules like 916, 917 are fully pressed into the uncured polymer 915 and interspersed and situated among the grown CNTs 912. The die 910 and lead frame 920 are advanced toward each other to compress and rupture some of the microcapsules like 906 and 907, the contents of which polymerize and cure into part or all the final self-healing die attach. The rest of the microcapsules like 916, 917 are unruptured and their outside diameter is in a range between a little more than the length of CNTs 912 down to about half as long. (See range of their size parameter k1 given by Appendix C, Expression (C-7).) The microcapsules like 916, 917 remain unruptured between die 910 and lead frame 920 until sufficient thermal or delaminating stress ruptures them and initiates and promotes self-healing.

Self-healing CNT die attach embodiments as in FIGS. 11A-11D confer beneficially-high electrical conductivity and high thermal conductivity and self-healing. Appendix C provides further description of self-healing CNT die attach herein for various CNT die attach embodiments with microcapsules.

APPENDIX C

Grown CNTs with Included Microcapsules

Figure 13:
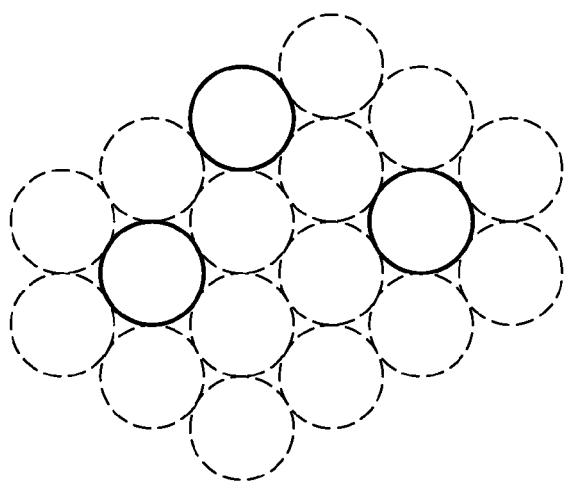
FIG. 13 is a view of distributed equal-size microcapsules each having circular girth and viewed broadside, together with dotted circles as if more microcapsules were maximally packed in a layer, see Appendix C.

The microcapsule size and area-density of unstacked equal-diameter microcapsules distributed as in FIG. 13 in a single layer or level across the grown CNTs are determined based on the following factors: 1) recognize volume equality whereby the ruptured microcapsule contents have sufficiently low viscosity or wetting ability and produce enough polymer to fill that part of final volume A*BLT of the die attach between the IC die and the pad which is not already filled with CNTs, 2) deliver a moderate to low occupation ratio f of microcapsules that leaves space for the thermally conductive CNTs and die attach adhesive, 3) distribute the polymer-producing monomer/oligomer and catalyst evenly through the CNTs so that voids and hotspots are minimized. Equation (C-1) expresses volume equality using listed parameters:

$$4/3\pi r^3 Nc = A(2(r+\delta)k)(1-d) \quad (C-1)$$

TABLE C1

PARAMETERS FOR APPENDIX C

| | |
|---|---|
| (1 − d): | Volume fraction d is combined volume of layer 915 with CNT bristles, per unit volume of space between die and pad. (1 − d) is the remaining volume fraction to be filled by the microcapsule adhesive. |
| f: | Occupation ratio of area occupied by spherical microcapsules per unit area of die attach or die pad. |
| k: | Ratio of final spacing BLT = B between die and die pad to outside diameter of microcapsule 2(r + δ). |
| $4/3\pi r^3$: | Volume of interior of spherical microcapsule having radius r. |
| N: | Number of microcapsules distributed across area A broadside. |
| N/A: | Area-density, or number of microcapsules per unit area. |
| c: | Volume ratio of cured polymer in die attach to volume of reactant and catalyst in microcapsules. |
| 2(r + δ): | Outside diameter of spherical microcapsule having interior radius r and wall thickness δ. |
| 2(r + δ)k = B: | The spacing BLT between die and die pad, less than or equal to grown CNT length so CNTs thermally contact both die and die pad. |
| V: | Aggregate volume of microcapsules, $4/3\pi(r + \delta)^3 N$. |

An occupation ratio f in a range zero-to-one [0:1] for the microcapsules in FIG. 13 is expressed by Equation (C-2):

$$0.91 f = \pi(r+\delta)^2 N/A \quad (C-2)$$

Figure 13A:
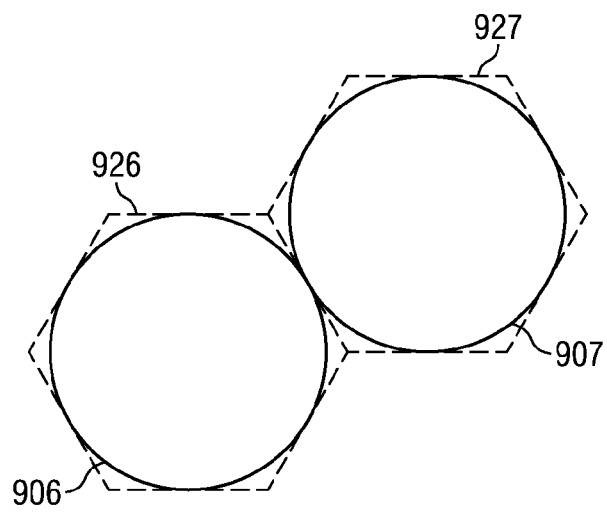
FIG. 13A is a broadside view of microcapsules with dotted hexagons for geometrically visualizing possible packing of microcapsules in FIG. 13, see Appendix C.

In words, Equation (C-2) expresses the idea that the microcapsules as circular dots packed solid in a single unstacked layer $N\pi(r+\delta)^2$ over the entire die attach area A would occupy about 91% of that area A viewed broadside. (The girth of each microcapsule is essentially a circle that maximally packs with other microcapsules as if each such circle were circumscribed by a hexagon. See FIG. 13A illustrating, e.g., two microcapsules 906, 907 with circumscribed hexagons 926, 927. The ratio of area of a circle to its circumscribed hexagon is $\pi/(2\sqrt{3}) \sim 0.91$). A sparser distribution of microcapsules, as in FIG. 13, can be approximately considered as having occupation ratio f equal to a number of occupied hexagons to total number of hexagons in a geometric honeycomb. The spherical containment shell of each microcapsule is made thin enough and/or its chemistry soluble or reactive enough that the shell after rupture negligibly impedes the CNTs and does not otherwise significantly affect the properties of the resulting die attach.

The size ratio k of BLT/microcapsule outside-diameter is solved-for next. The size ratio k is found by substituting for the quantity (A/N) in volume equality Equation (C-1) using occupation ratio Equation (C-2). This delivers Equation (C-3) for the size ratio k in terms of basic parameters as follows:

$$k=[f/(1-d)]c[r/(r+\delta)]^3(0.91)(\frac{2}{3}) \quad (C-3)$$

Given a reaction volume constant c close to unity and an inside/outside radius ratio $0.9=[r/(r+\delta)]$, Equation (C-3) simplifies to a joint function primarily of occupation ratio f and volume fraction d for layer 915 with CNT forest:

$$k=0.44c[f/(1-d)] \quad (C-4)$$

The occupation ratio f, and the volume fraction d for layer 915 with CNT forest, each importantly affect the size ratio k and vice-versa. Decreasing occupation ratio f means either increasing the thickness of uncured die adhesive layer 915 or decreasing the value of k (by using larger microcapsules relative to BLT and fewer of them because occupation ratio f is decreased), or some of both measures. Conversely, decreasing the value of k, by using larger microcapsules relative to BLT, means less thickness of uncured die adhesive layer 915 is needed when maintaining a given occupation ratio f (the fractional area coverage of the distributed microcapsules).

Parameter k expresses the length of CNTs or BLT relative to the diametric size of the microcapsules. For some embodiments, let a range for k be given by an inequality Expression (C-5), signifying microcapsules 906, 907 in diameter roughly 1.5-to-3 times BLT for rupturing in FIG. 11C, Step 5.

$$0.3 \leq k \leq 0.7. \quad (C-5)$$

The volume fraction d for layer 915 with CNT forest is considered according to Equation (C-6), which is based on Equation (C-4). When k=0.44 (near the center of the range in Expression (C-5), then d=1−f. Using a lower occupation ratio f of microcapsules understandably calls for more thickness of uncured die adhesive layer 915 to more nearly fill up the intended BLT space between die 910 and lead frame 920. BLT is the separation distance between the die and die pad after the pressing them together with die attach materials in between.

$$d=1-f[0.44c/k] \quad (C-6)$$

Prior to rupturing the rupturable microcapsules, the sum of volumes V of microcapsules plus dispensed adhesive should be approximately 100% of A*B (area times BLT), so $$d+V/(AB)=1 \quad (C-6A)$$

$$Bd+V/A=B \quad (C-6A)$$

Thus, the aggregate volume V of microcapsules is related to thickness Bd of dispensed die attach adhesive as a function that decreases with increased thickness of dispensed die attach for a given BLT=B. See FIG. 11B.

The microcapsules may be of equal size as in FIG. 13, or may have different sizes as shown in FIGS. 11A-11C. For instance, in FIG. 11C, some of the smaller microcapsules are below the range in Expression (C-5) and instead are suitably in a range of their size parameter k1 given by Expression (C-6), which calls for microcapsules 906, 907 in diameter roughly in a range 0.5 to 1.1 times BLT, which gives reciprocal values to the parameter k1:

$$0.9 \leq k1 \leq 2.0. \quad (C-7)$$

These small microcapsules like 916, 917 remain unruptured between die and lead frame until sufficient thermal or delaminating stress ruptures them and initiates and promotes self-healing.

Aspects (See Explanatory Notes at End of this Section)

1A. The article claimed in claim 1 wherein the second side of said die is substantially planar.

1B. The article claimed in claim 1 wherein said diffusion barrier is substantially planar and covers substantially all of the second side of said die.

1B1. The article claimed in claim 1B wherein said mat of carbon nanotubes extends over substantially all of said diffusion barrier.

1C. The article claimed in claim 1 wherein said mat of carbon nanotubes includes mostly carbon nanotubes that are substantially perpendicular to said diffusion barrier.

1D. The article claimed in claim 1 wherein said mat of carbon nanotubes extends over substantially all of said diffusion barrier.

1E. The article claimed in claim 1 wherein said mat of carbon nanotubes physically contacts said die pad.

1F. The article claimed in claim 1 wherein said die attach adhesive is a material selected from the group consisting of: 1) epoxy, 2) BMI (bismaleimide), 3) acrylate, 4) polyimide.

1G. The article claimed in claim 1 further comprising at least two upraised elements on the second side of said die and having a height approximately equal to a thickness of said mat of carbon nanotubes.

6A. The article claimed in claim 6 wherein said second CNT mat is interdigitated with said first-named mat of carbon nanotubes densely at the scale of bristle-to-bristle separation in each of said mats.

8A. The article claimed in claim 8 wherein at least some of said microcapsules include a flowable polymerizable material for forming a polymer selected from the group consisting of: 1) epoxies, 2) urethanes, 3) silicones, 4) polyimides, 5) polyesters, 6) organosilicon polymers.

8A1. The article claimed in claim 8A wherein at least some others of said microcapsules include a catalyst for polymerizing the polymerizable material.

8B. The article claimed in claim 8 wherein said die and said die pad have a separation distance between them, and said microcapsules mostly have outside diameters between about 0.5 to 1.1 times that separation distance.

11A. The process claimed in claim 11 further comprising using a steam feedback monitor to regulate the rate of the growing.

11B. The process claimed in claim 11 further comprising wet chemical spin etching on said second side prior to forming the diffusion barrier.

12A. The process claimed in claim 12 wherein the backgrinding of the semiconductor wafer confers a wafer thickness reduction in a range 30%-70% prior to forming the diffusion barrier.

13A. The process claimed in claim 13 further comprising wet chemical spin etching on said second side prior to performing the oxidation of the semiconductor on said second side.

15A. The process claimed in claim 15 further comprising using a delivery system for one or more of such precursors and operable to provide a range of flow rates in which to optimize the growth of carbon nanotubes.

22A. The assembly process claimed in claim 22 wherein the die pad is part of a lead frame.

22B. The assembly process claimed in claim 22 further comprising distributing microcapsules prior to the performing of pick-and-place, and wherein the die and the die pad have a separation distance between them after the pressing, and the microcapsules prior to the pressing mostly have outside diameters between about 1.5 to 3 times that separation distance.

22B1. The assembly process claimed in claim 22B wherein the microcapsules have an aggregate volume prior to the pressing, said aggregate volume related to thickness of dispensed die attach adhesive as a function that decreases with increased thickness of dispensed die attach for a given said separation distance.

22C. The assembly process claimed in claim 22 wherein the pressing causes expulsion of some of the die attach adhesive during pressing, so that such expelled die attach adhesive seals the periphery of the integral mass between the die and the die pad.

22D. The assembly process claimed in claim 22 further comprising orienting the die pad upside down with the die attach adhesive underneath, and dusting the mat of carbon nanotubes with microcapsules prior to the performing of pick-and-place upward against the die attach adhesive.

31A. The article claimed in claim 31 wherein the diffusion barrier and the mat of carbon nanotubes both cover substantially all of the second side of said wafer.

Notes: Aspects are description paragraphs that might be offered as claims in patent prosecution. The above dependently-written Aspects have leading digits and may have internal dependency designations to indicate the claims or aspects to which they pertain. The leading digits and alphanumerics indicate the position in the ordering of claims at which they might be situated if offered as claims in prosecution.

A few preferred embodiments have been described in detail hereinabove. It is to be understood that the scope of the invention comprehends embodiments different from those described, as well as described embodiments, yet within the inventive scope. Specific values pertaining to particular systems have been used by way of example and not of limitation, and the embodiments are applicable to other materials and systems in general. Integrated circuitry comprehends digital, analog and mixed signal (digital/analog) integrated circuits, ASIC circuits, FPGAs, PALs, PLAs, decoders, memories, non-software based processors, microcontrollers and other circuitry, and microprocessors and microcomputers of any architecture, or combinations thereof. Internal and external couplings and connections can be ohmic, capacitive, inductive, photonic, and direct or indirect via intervening circuits or otherwise as desirable. Implementation is contemplated in discrete components or fully integrated circuits in any materials family and combinations thereof. Process diagrams and block diagrams herein are representative of flows and/or structures for operations of any embodiments whether of hardware, software, or firmware, and processes of manufacture thereof.

Various embodiments suitably provide products using any type of semiconductor chip, discrete or integrated circuit, and the material of the semiconductor chip may comprise silicon, silicon germanium, gallium arsenide, or any other semiconductor or compound material used in integrated circuit manufacturing. Also, various embodiments suitably have different types of packaging such as BGA, QFN, SON, surface mount devices, small outline devices, leaded devices and other devices.

One having ordinary skill in the relevant art will readily recognize that the invention can be practiced without one or more of the specific details or with other methods. The present invention is not limited by the illustrated ordering of acts or events, as some acts may occur in different orders and/or concurrently with other acts or events.

While this invention has been described with reference to illustrative embodiments, this description is not to be construed in a limiting sense. Various modifications and combinations of the illustrative embodiments, as well as other embodiments of the invention will be apparent to persons skilled in the art upon reference to the description and may be made. The terms "including", "includes", "having", "has", "with", or variants thereof are used in the detailed description and/or the claims to denote non-exhaustive inclusion in a manner similar to the term "comprising". It is therefore contemplated that the appended claims and their equivalents encompass or cover any embodiments, modifications, and forms as fall within the true scope of the invention.

What is claimed is:

1. An article of manufacture comprising:
   a semiconductor die having an integrated circuit on a first side of said die;
   a diffusion barrier on a second side of the die opposite the first side;
   a mat of carbon nanotubes rooted to said diffusion barrier;
   a die attach adhesive forming an integral mass with said mat of said carbon nanotubes; and
   a die pad adhering to said die attach adhesive and said mat of carbon nanotubes for at least some thermal transfer between said die and said die pad via said carbon nanotubes.

2. The article claimed in claim 1 wherein said carbon nanotubes have lengths mostly in a range between 5 microns and 110 microns.

3. The article claimed in claim 1 wherein said carbon nanotubes exceed approximately 1000 (one thousand) bristles per square micron on said diffusion barrier.

4. The article claimed in claim 1 further comprising a second mat of carbon nanotubes, said second mat rooted to said die pad.

5. The article claimed in claim 4 wherein said second mat of carbon nanotubes is interdigitated with said mat of carbon nanotubes rooted to said diffusion barrier.

6. The article claimed in claim 4 wherein said second mat of carbon nanotubes is interdigitated, along at least about half the thickness of said die attach adhesive, with said mat of carbon nanotubes rooted to said diffusion barrier.

7. The article claimed in claim 1 wherein said carbon nanotubes pierce a high thermal-resistivity skin of said die attach adhesive.

8. The article claimed in claim 1 further comprising microcapsules distributed in said die attach adhesive.

9. The article claimed in claim 1 further comprising stitch-attached connectors to the integrated circuit.

10. The article claimed in claim 1 further comprising a molded plastic package around the combination of die, die attach adhesive with the carbon nanotubes, and at least part of the die pad, whereby a packaged integrated circuit is formed.

11. The article claimed in claim 1 wherein the second side of said die is substantially planar.

12. The article claimed in claim 1 wherein said diffusion barrier is substantially planar and covers substantially all of the second side of said die.

13. The article claimed in claim 12 wherein said mat of carbon nanotubes extends over substantially all of said diffusion barrier.

14. The article claimed in claim 1 wherein said mat of carbon nanotubes includes mostly carbon nanotubes that are substantially perpendicular to said diffusion barrier.

15. The article claimed in claim 1 wherein said mat of carbon nanotubes extends over substantially all of said diffusion barrier.

16. The article claimed in claim 1 wherein said mat of carbon nanotubes physically contacts said die pad.

17. The article claimed in claim 1 wherein said die attach adhesive is a material selected from the group consisting of: 1) epoxy, 2) BMI (bismaleimide), 3) acrylate, 4) polyimide.

18. The article claimed in claim 1 further comprising at least two upraised elements on the second side of said die and having a height approximately equal to a thickness of said mat of carbon nanotubes.

19. The article claimed in claim 6 wherein said second CNT mat is interdigitated with said first-named mat of carbon nanotubes densely at the scale of bristle-to-bristle separation in each of said mats.

20. The article claimed in claim 8 wherein at least some of said microcapsules include a flowable polymerizable material for forming a polymer selected from the group consisting of: 1) epoxies, 2) urethanes, 3) silicones, 4) polyimides, 5) polyesters, 6) organosilicon polymers.

21. The article claimed in claim 20 wherein at least some others of said microcapsules include a catalyst for polymerizing the polymerizable material.

22. The article claimed in claim 8 wherein said die and said die pad have a separation distance between them, and said microcapsules mostly have outside diameters between about 0.5 to 1.1 times that separation distance.

23. A process of manufacturing comprising:
fabricating integrated circuits on a first side of a semiconductor wafer;
forming a diffusion barrier on a second side of the semiconductor wafer opposite the first side;
growing a mat of carbon nanotubes on the diffusion barrier; and
adhering adhesive dicing tape to the mat of carbon nanotubes.

24. The process claimed in claim 23 further comprising backgrinding the semiconductor wafer prior to forming the diffusion barrier.

25. The process claimed in claim 23 further comprising performing an oxidation of the semiconductor wafer on said second side prior to forming the diffusion barrier.

26. The process claimed in claim 23 further comprising depositing a growth-promoting catalyst on the diffusion barrier prior to growing the mat of carbon nanotubes.

27. The process claimed in claim 26 further comprising providing a growth atmosphere selected from the group consisting of: 1) acetylene and carbon dioxide, 2) methanol, 3) cyclopentene oxide, as flowed precursor and executing the growing at a temperature less than or equal to about 400° C.

28. The process claimed in claim 23 further comprising using a steam feedback monitor to terminate the growing.

29. The process claimed in claim 23 wherein the growing produces carbon nanotubes having lengths mostly in a range between 5 microns and 110 microns.

30. The process claimed in claim 23 wherein the growing produces carbon nanotubes in excess of approximately 1000 (one thousand) bristles per square micron on the diffusion barrier.

31. The process claimed in claim 23 further comprising singulating the wafer and the mat of carbon nanotubes and the dicing tape into die, each die retaining a corresponding portion of the mat of carbon nanotubes and of the dicing tape.

32. The process claimed in claim 23 further comprising etching the second side prior to forming the diffusion barrier.

33. The process claimed in claim 23 further comprising using a steam feedback monitor to regulate the rate of the growing.

34. The process claimed in claim 23 further comprising wet chemical spin etching on said second side prior to forming the diffusion barrier.

35. The process claimed in claim 24 wherein the backgrinding of the semiconductor wafer confers a wafer thickness reduction in a range 30%-70% prior to forming the diffusion barrier.

36. The process claimed in claim 25 further comprising wet chemical spin etching on said second side prior to performing the oxidation of the semiconductor on said second side.

37. The process claimed in claim 27 further comprising using a delivery system for one or more of such precursors and operable to provide a range of flow rates in which to optimize the growth of carbon nanotubes.

38. An assembly process of manufacturing comprising:
providing a semiconductor die that has a mat of carbon nanotubes adhering to adhesive dicing tape; and
exposing the dicing tape to radiant energy so that the dicing tape becomes less adhesive, and then detaching the dicing tape from the mat of carbon nanotubes leaving the mat of carbon nanotubes substantially intact on the die.

39. The assembly process claimed in claim 38 further comprising
dispensing die attach adhesive to a die pad;
performing a pick-and-place of the die with the mat of carbon nanotubes onto the die attach adhesive on the die pad; and
pressing the die and die pad together so that the mat of carbon nanotubes and the die attach adhesive form an integral mass of die attach material between the die and the die pad.

40. The assembly process claimed in claim 39 further comprising operating a dispenser machine selected from the group consisting of: 1) showerhead dispenser, 2) spray dispenser, 3) needle dispenser, to perform the dispensing of the die attach adhesive to the die pad.

41. The assembly process claimed in claim 39 further comprising distributing microcapsules prior to the performing of pick-and-place, at least some of which microcapsules differ from each other by including jointly-active precursors for healing the die attach adhesive.

42. The assembly process claimed in claim 41 wherein the pressing the die and die pad together ruptures at least some of the microcapsules and augments the integral mass.

43. The assembly process claimed in claim 39 further comprising operating a dispenser holding a suspension of microcapsules in liquid die attach adhesive to perform the dispensing of the die attach adhesive to the die pad.

44. The assembly process claimed in claim 39 further comprising spraying the mat of carbon nanotubes with some die attach adhesive prior to the performing of pick-and-place against the lead frame.

45. The assembly process claimed in claim 39 further comprising curing the die attach adhesive so that the integral mass becomes a cured die attach for some thermal transfer between the die and the die pad via the carbon nanotubes.

46. The assembly process claimed in claim 39 further comprising stitch-attaching connectors to a functional side of the semiconductor die.

47. The assembly process claimed in claim 39 further comprising molding a plastic package around the combination of die, die attach material with the carbon nanotubes, and at least part of the die pad, whereby producing an assembled integrated circuit.

48. The assembly process claimed in claim 39 wherein the die pad is part of a lead frame.

49. The assembly process claimed in claim 39 further comprising distributing microcapsules prior to the performing of pick-and-place, and wherein the die and the die pad have a separation distance between them after the pressing, and the microcapsules prior to the pressing mostly have outside diameters between about 1.5 to 3 times that separation distance.

50. The assembly process claimed in claim 49 wherein the microcapsules have an aggregate volume prior to the pressing, said aggregate volume related to thickness of dispensed die attach adhesive as a function that decreases with increased thickness of dispensed die attach for a given said separation distance.

51. The assembly process claimed in claim 39 wherein the pressing causes expulsion of some of the die attach adhesive during pressing, so that such expelled die attach adhesive seals the periphery of the integral mass between the die and the die pad.

52. The assembly process claimed in claim 39 further comprising orienting the die pad upside down with the die attach adhesive underneath, and dusting the mat of carbon nanotubes with microcapsules prior to the performing of pick-and-place upward against the die attach adhesive.

53. An article of manufacture comprising:
a semiconductor wafer having integrated circuits on a first side of said wafer;
a diffusion barrier on at least part of a second side of said wafer opposite the first side;
a mat of carbon nanotubes rooted to said diffusion barrier; and
adhesive dicing tape adhering to the mat of carbon nanotubes.

54. The article claimed in claim 53 wherein the carbon nanotubes have lengths mostly in a range between 5 microns and 110 microns.

55. The article claimed in claim 53 wherein the carbon nanotubes exceed approximately 1000 (one thousand) bristles per square micron on said diffusion barrier.

56. The article claimed in claim 53 wherein the diffusion barrier and the mat of carbon nanotubes both cover substantially all of the second side of said wafer.

57. An article of manufacture comprising:
a semiconductor die having an integrated circuit on a first side of said die;
a diffusion barrier on a second side of the die opposite the first side;
a mat of carbon nanotubes rooted to said diffusion barrier; and
adhesive dicing tape adhering to the mat of carbon nanotubes.

58. The article claimed in claim 57 wherein the carbon nanotubes have lengths mostly in a range between 5 microns and 110 microns.

59. The article claimed in claim 57 wherein the carbon nanotubes exceed approximately 1000 (one thousand) bristles per square micron on said diffusion barrier.

60. The article claimed in claim 57 wherein the adhesive dicing tape has a radiant energy-sensitive adhesive whereby said dicing tape is more readily detachable from said mat of carbon nanotubes after exposure.

* * * * *